United States Patent
Bhakta et al.

(10) Patent No.: US 7,876,123 B2
(45) Date of Patent: Jan. 25, 2011

(54) HIGH SPEED MULTIPLE MEMORY INTERFACE I/O CELL

(75) Inventors: Dharmesh Bhakta, Hayward, CA (US); Hong-Him Lim, Cupertino, CA (US); Cheng-Gang Kong, Saratoga, CA (US); Todd Randazzo, Mound, MN (US)

(73) Assignee: LSI Corporation, Milpitas, CA (US)

( * ) Notice: Subject to any disclaimer, the term of this patent is extended or adjusted under 35 U.S.C. 154(b) by 106 days.

(21) Appl. No.: 12/109,497

(22) Filed: Apr. 25, 2008

(65) Prior Publication Data

US 2009/0091349 A1 Apr. 9, 2009

Related U.S. Application Data

(60) Provisional application No. 60/978,424, filed on Oct. 9, 2007, provisional application No. 60/978,428, filed on Oct. 9, 2007.

(51) Int. Cl.
*H03K 17/16* (2006.01)

(52) U.S. Cl. .............................. 326/30; 326/35; 326/86; 326/87

(58) Field of Classification Search .................. 326/62, 326/82–83, 86–87; 327/108, 109
See application file for complete search history.

(56) References Cited

U.S. PATENT DOCUMENTS

| | | | |
|---|---|---|---|
| 5,481,207 A * | 1/1996 | Crafts | 326/86 |
| 6,636,069 B1 * | 10/2003 | Muljono | 326/30 |
| 2005/0117433 A1 * | 6/2005 | Fujisawa | 365/226 |
| 2006/0091900 A1 * | 5/2006 | Kang et al. | 326/30 |

\* cited by examiner

*Primary Examiner*—Rexford N Barnie
*Assistant Examiner*—Jany Tran
(74) *Attorney, Agent, or Firm*—Christopher P. Maiorana, PC

(57) ABSTRACT

An input/output (I/O) cell including one or more driver-capable segments and one or more on-die termination (ODT) capable segments. The I/O cell may be configured as an output driver in a first mode and Thevenin equivalent termination in a second mode.

22 Claims, 25 Drawing Sheets

(A)

(B)

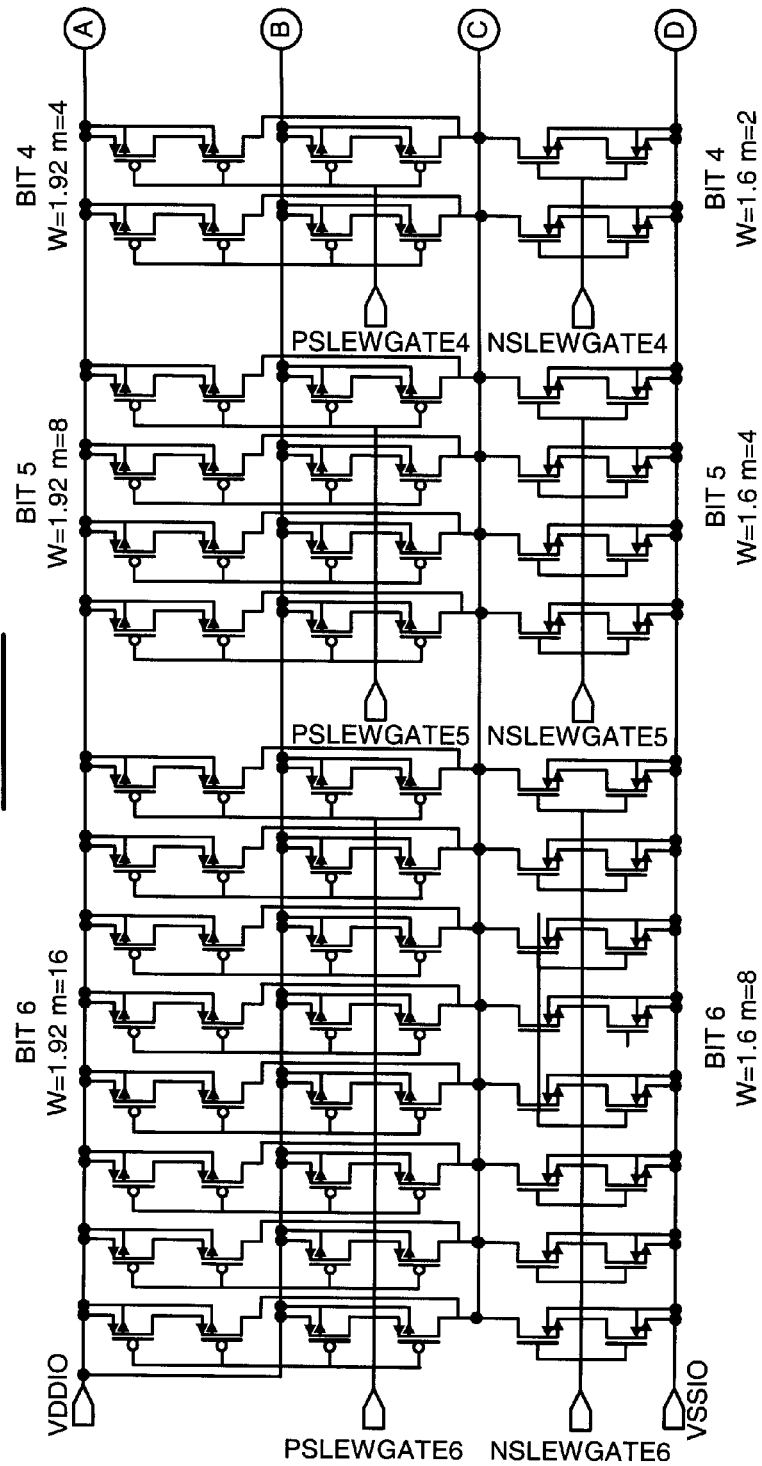

HIGH SPEED MULTIPLE MEMORY INTERFACE I/O CELL

This application claims the benefit of U.S. Provisional Application Nos. 60/978,424 and 60/978,428, filed Oct. 9, 2007, and are hereby incorporated by reference in their entirety.

FIELD OF THE INVENTION

The present invention relates to memory interfacing generally and, more particularly, to a high speed multiple memory interface I/O cell.

BACKGROUND OF THE INVENTION

Separate input/output (I/O) solutions have been designed to support DDR2, DDR3, RLDRAM and SRAM memory interface specifications. No one solution exists that supports multiple memory interfaces. It would be desirable to have a solution that allows for interchangeability between DDR2/DDR3/RLDRAM/SRAM memory interfaces with one silicon solution.

SUMMARY OF THE INVENTION

In a first aspect, the present invention concerns an input/output (I/O) cell comprising (i) one or more driver-capable segments and (ii) one or more on-die termination (ODT) capable segments. In a second aspect, the present invention concerns a binary programmable predriver comprising (i) a data enable logic, (ii) a sequencer, (iii) a plurality of first drivers and (iv) a plurality of second drivers. In a third aspect, the present invention concerns a dynamic on-die termination sequencer comprising (i) a first circuit configured to generate a first control signal and (ii) a second circuit configured to generate a second control signal. In a fourth aspect, the present invention concerns an input receiver. In a fifth aspect, the present invention concerns a calibration circuit.

The objects, features and advantages of the present invention include providing a high speed multiple memory interface I/O cell that may (i) allow a single application specific integrated circuit (ASIC) to support multiple memory interface specifications (e.g., DDR2 and DDR3, RLDRAM and SRAM, etc.), (ii) provide a single bidirectional I/O buffer capable of meeting multiple 1.5V and 1.8V specifications, (iii) provide an I/O buffer with user-selectable impedance, (iv) provide process voltage, and temperature (PVT) compensation, (v) provide linear I-V characteristics, (vi) cover multiple I/O transmit voltages, (vii) provide on-die termination (ODT), (viii) provide user-selectable thevenin-equivalent termination (TET), (ix) compare input voltage to an externally provided reference voltage, (x) process a wide range of input voltage swings, (xi) permit user-programmable slew rate/di/dt reduction and/or (xii) provide dynamic ODT control.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides an input/output (I/O) cell that may programmed for compliance with multiple memory interface specifications (e.g., DDR2, DDR3, RLDRAM, SRAM, etc.). In one example, an I/O cell implemented in accordance with the present invention may provide a feature set that generally supports migration between DDR2, DDR3, RLDRAM, and/or SRAM memory interfaces.

Each memory interface specification generally has different I/O feature sets including specification of, for example, driver impedance, on-die termination impedance, I/O voltage levels, and slew rate as summarized in the following TABLES 1-4. Driver impedance ranges and tolerances of DDR2, DDR3, RLDRAM, and SRAM memory interfaces may be summarized in the following TABLE 1:

TABLE 1

|  | Supported Driver Impedance Range (ohms) | Additional Specifications |
| --- | --- | --- |
| RLDRAM | 30 to 45 | Tolerance < 15% |
| SRAM | 30 to 45 | Tolerance < 15% |
| DDR2 SDRAM | 18 to 27 | Tolerance < 15% |
| DDR3 SDRAM | 34 to 50 | Jedec Defined |

On-die-termination (ODT) impedance ranges and tolerances of DDR2, DDR3, RLDRAM, and SRAM memory interfaces may be summarized in the following TABLE 2:

TABLE 2

|  | I/O ODT Impedance (ohms) | Additional Specifications |
| --- | --- | --- |
| RLDRAM | 50/150 | Tolerance < 15% |
| QDR/DDR SRAM | 50/150 | Tolerance < 15% |
| DDR2 SDRAM | 50/75/150 | Tolerance < 15% |
| DDR3 SDRAM | 40/60/120 | Jedec Defined |

Input/output voltages of DDR2, DDR3, RLDRAM, and SRAM memory interfaces may be summarized in the following TABLE 3:

TABLE 3

|  | I/O Voltage |
| --- | --- |
| RLDRAM | 1.8 V ± 0.1 V |
| QDR/DDR SRAM | 1.40 V to 1.9 V |
| DDR2 SDRAM | 1.7 V to 1.9 V |
| DDR3 SDRAM | 1.425 V to 1.575 V |

Slew rate ranges of DDR2, DDR3, RLDRAM, and SRAM memory interfaces may be summarized in the following TABLE 4:

TABLE 4

| Description | DDR3 SDRAM | | DDR2 SDRAM SRAM RLDRAM | |
| --- | --- | --- | --- | --- |
|  | MIN | MAX | MIN | MAX |
| Rising Edge Output SLR | 2.5 V/ns | 5 V/ns | 1.5 V/ns | 5 V/ns |
| Falling edge Output SLR | 2.5 V/ns | 5 V/ns | 1.5 V/ns | 5 V/ns |

Figure 1:
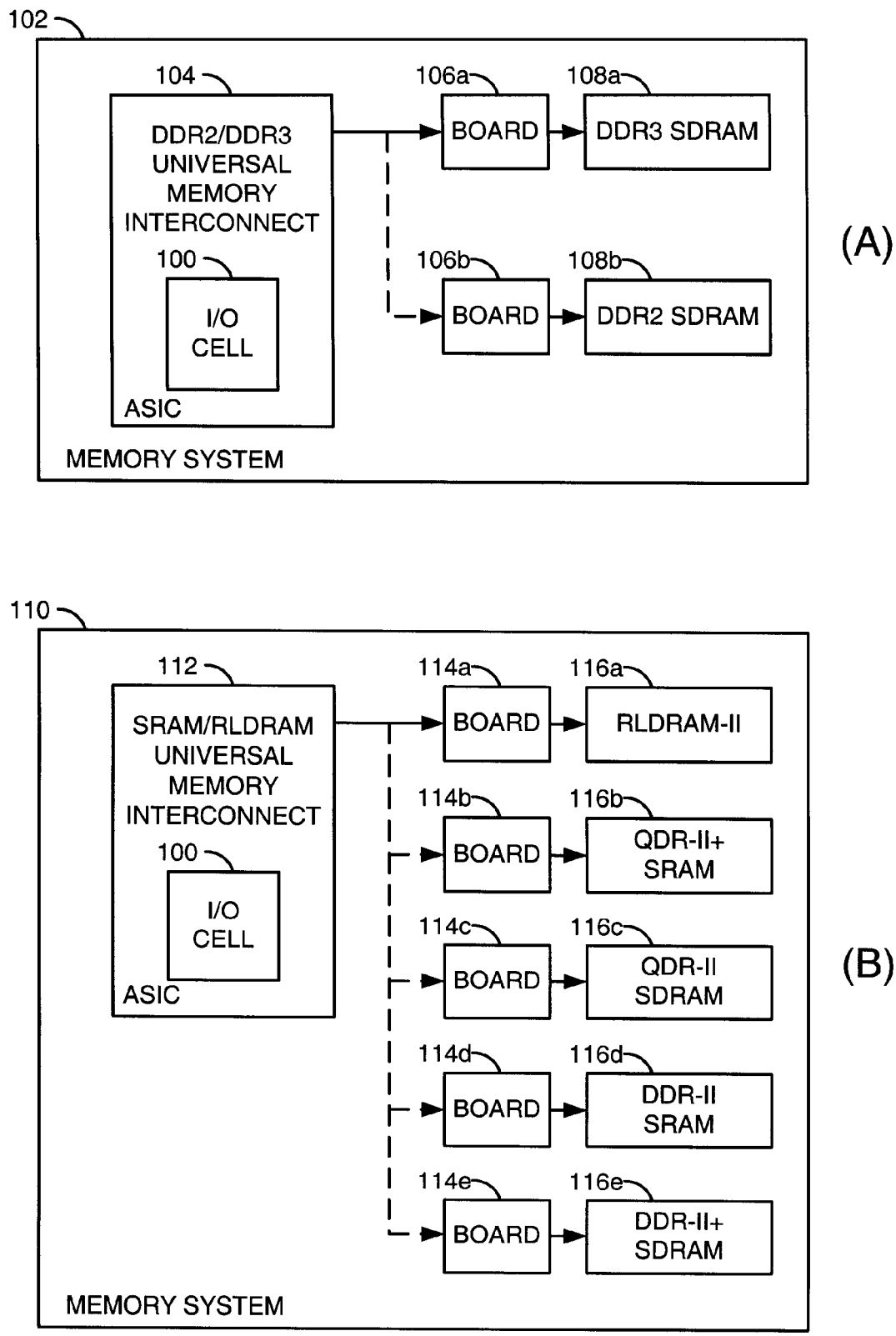
FIGS. 1(A-B) are diagrams illustrating example applications of the present invention.

Referring to FIGS. 1(A-B), diagrams are shown illustrating example applications of an I/O cell 100 in accordance with the present invention. The present invention generally provides a combination I/O buffer (driver) that may be used, for example, as part of a DDR2/DDR3 interface (FIG. 1A) or as part of a SRAM/RLDRAM interface (FIG. 1B). In one example, a DDR2/DDR3 memory system 102 may be implemented comprising an application specific integrated circuit (ASIC) 104. The ASIC 104 may incorporate one or more I/O buffers 100 implemented in accordance with the present invention. In one example, the ASIC 104 may be mounted on a board 106a along with a DDR3 SDRAM 108a. Alternatively, the ASIC 104 may be mounted on a board 106b configured for interfacing with a DDR2 SDRAM 108b.

Referring to FIG. 1B, an SRAM/RLDRAM memory system 110 may be implemented with an application specific integrated circuit (ASIC) 112 configured to control either SRAM or RLDRAM. The ASIC 112 may include one or more I/O buffers 100 in accordance with the present invention. In one example, the ASIC 112 may be mounted on a first board 114a configured to interface with an RLDRAMII memory 116a. In a second example, the ASIC 112 may be mounted on a board 114b configured to interface with a QDRII+ SRAM 116b. In a third example, the ASIC 112 may be mounted on a board 114c configured to interface to a QDRII SRAM 116c. In a fourth example, the ASIC 112 may be mounted on a board 114d configured to support a DDRII SRAM 116d. In a fifth example, the ASIC 112 may be mounted to a board 114e configured to interface with a DDRII+ SRAM 116e.

The I/O cell 100 may be implemented in single-ended or differential embodiments. The I/O cell 100 may be terminated high, terminated low, or terminated to VDDIO/2. The I/O cell 100 may also have any combination of pull-up or pull-down impedances.

Figure 2:
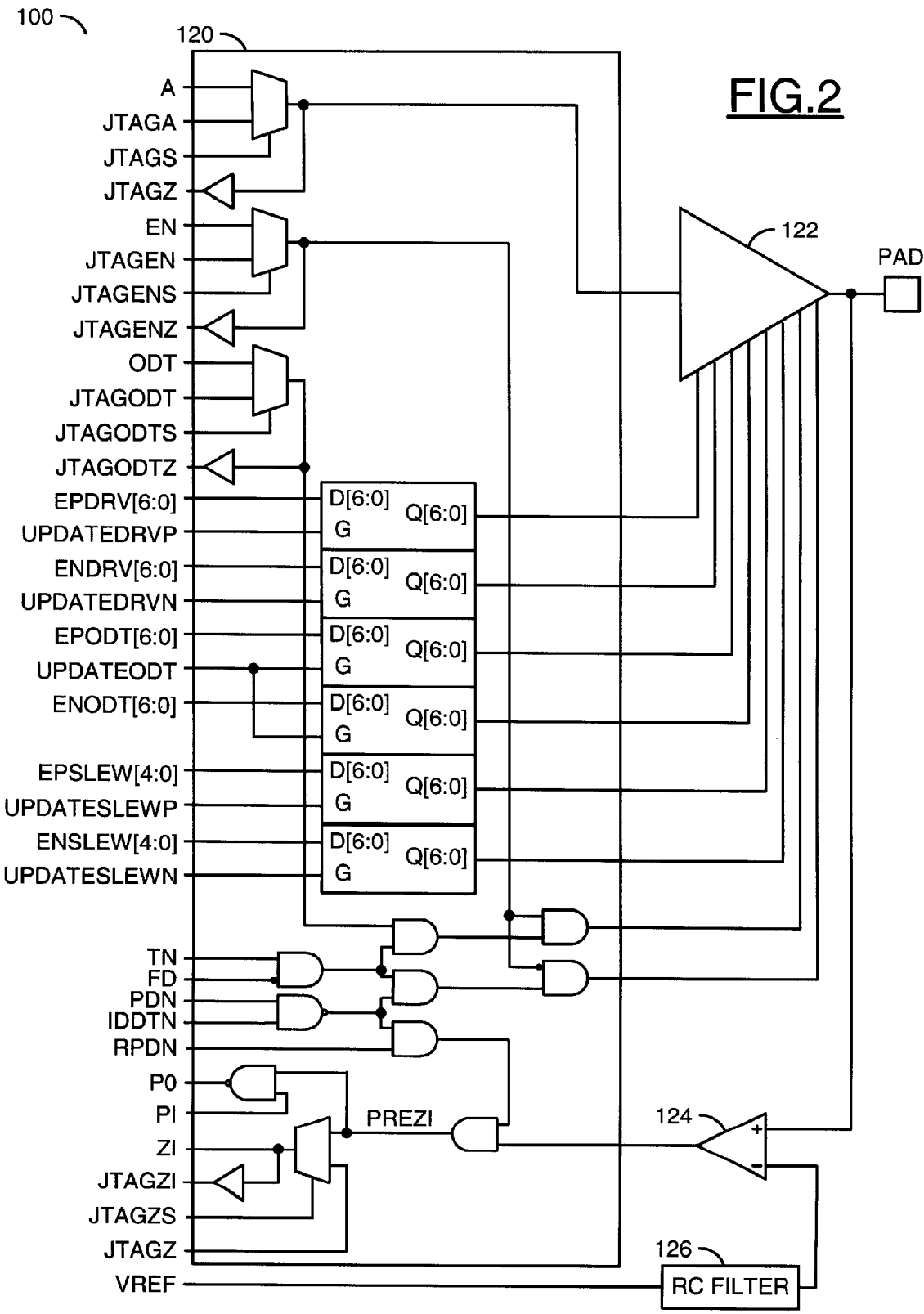
FIG. 2 is a diagram illustrating a single-ended buffer in accordance with the present invention.

Referring to FIG. 2, a diagram is shown illustrating the I/O cell 100 implemented in accordance with a single-ended embodiment. In one example, the I/O cell 100 may comprise a core interface circuit 120, a driver circuit 122, a receiver circuit 124 and an RC filter 126. The single-ended embodiment may have, in one example, an operating I/O supply voltage range of 1.40V to 1.90V. The output driver 122 may be capable of process/voltage/temperature (PVT) compensated impedances ranging from, in one example, about 18 ohms to about 50 ohms. The I/O cell 100 may provide an adjustable slew rate that may provide some control over di/dt. The input receiver 124 may use a pseudo-differential configuration. In one example, an inverting input of the input receiver 124 may receive a reference voltage (e.g., VREF). The RC filter 126 may be configured as a VREF noise filter. The I/O cell 100 may include on-die termination (ODT) networks. The ODT networks may comprise Thevenin equivalent termination (TET). In one example, the ODT network may provide PVT compensated impedances ranging from about 80 ohms to about 300 ohms (e.g., equivalent 40 ohms to 150 ohms to Vtt). The I/O cell 100 may provide complete JTAG test support.

Figure 3A:
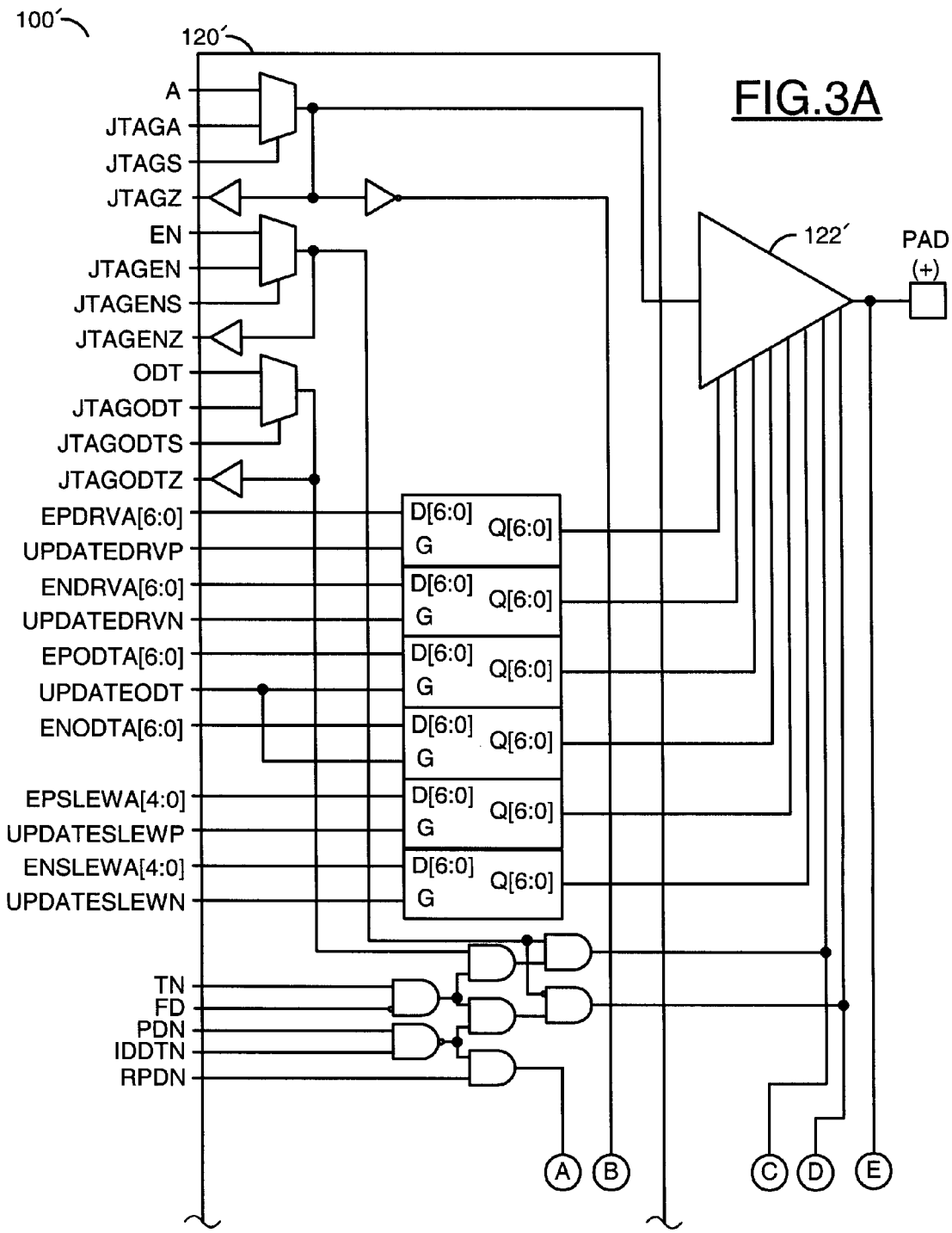
FIG. 3 is a diagram illustrating a differential buffer in accordance with the present invention.
Figure 3B:
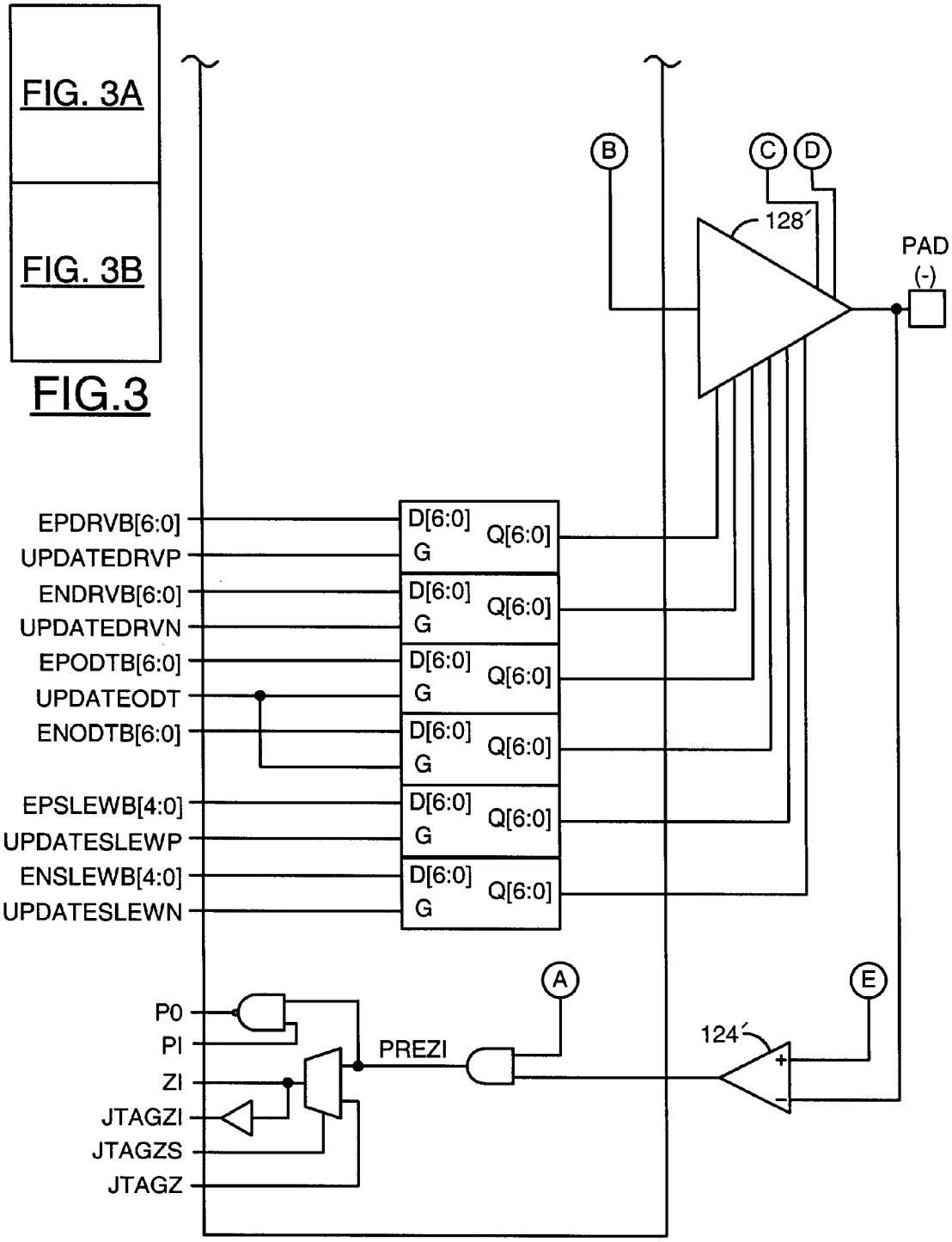

Referring to FIG. 3, a diagram is shown illustrating an I/O cell 100' implemented in accordance with a differential embodiment. The I/O cell 100' may comprise an interface circuit 120', a first driver 122', a receiver 124' and a second driver 128'. The differential embodiment may have, in one example, an operating I/O supply voltage range of about 1.40V to about 1.90V. The output drivers 122' and 128' may provide a complementary differential output. The output drivers 122' and 128' may be capable of process/voltage/temperature (PVT) compensated impedances ranging from, in one example, about 18 ohms to about 50 ohms. The I/O cell 100' may provide an adjustable slew rate that may provide some control over di/dt. The input receiver 124' may be implemented with a full differential configuration. The I/O cell 100' may include on-die termination (ODT) networks. The ODT networks may comprise Thevenin equivalent termination (TET). In one example, the ODT networks may provide PVT compensated impedances ranging from about 80 ohms to about 300 ohms (e.g., equivalent 40 ohms to 150 ohms to Vtt). The I/O cell 100' may provide complete JTAG test support.

Figure 4:
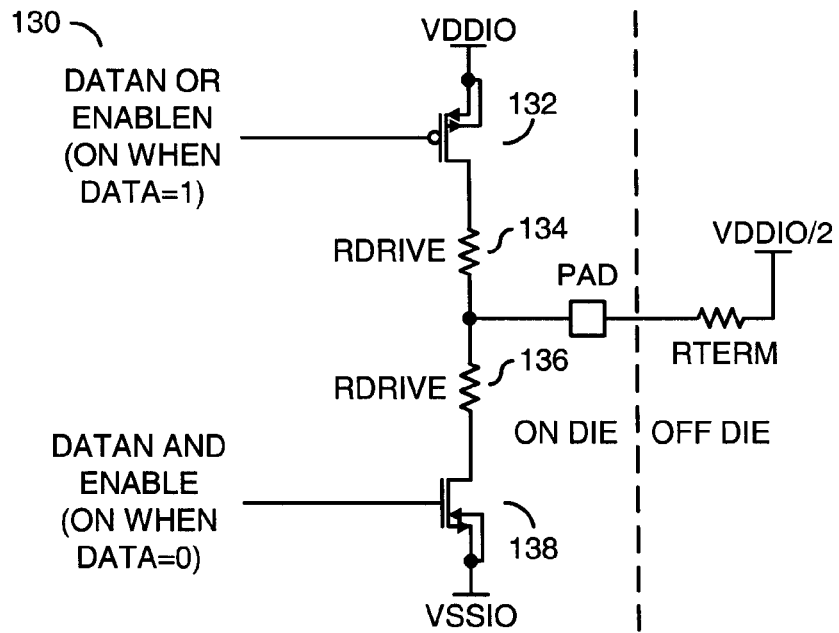
FIG. 4 is a diagram illustrating driver and on-die termination (ODT) capabilities of a buffer implemented in accordance with the present invention.
Figure 4:
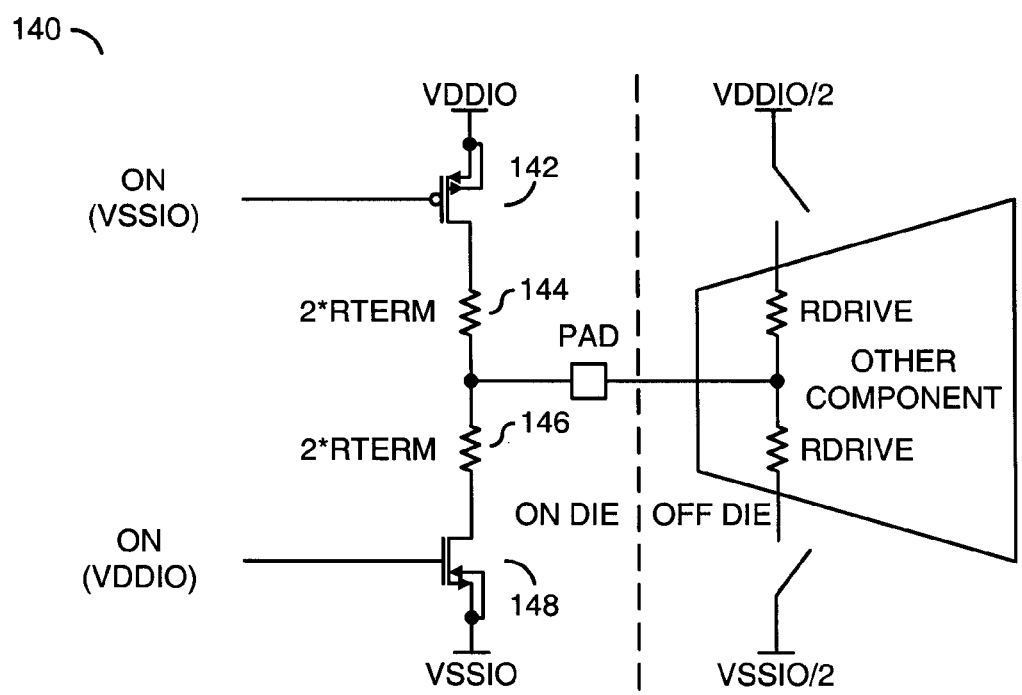

Referring to FIGS. 4(A-B), diagrams of circuits 130 and 140 are shown illustrating an output driver mode (FIG. 4A) and on-die termination (ODT) mode (FIG. 4B) of the I/O cell 100. When the I/O cell 100 is operating in the driver mode, the I/O cell 100 may provide a resistor-linearized driver. In the driver mode, either a pull-up transistor 132 is switched on (e.g., driving the PAD high through a resistor 134) or a pull-down transistor 138 is switched on (e.g., driving the PAD low through a resistor 136). In the drive mode, the PAD may be pulled-up to the supply voltage (e.g., VDDIO) or pulled-down to the supply ground potential (e.g., VSSIO) with a resistance value of Rdrive, where Rdrive may range from 18 ohms to 36 ohms. In the driver mode, the pull-up transistor 132 and the pull-down transistor 138 are not both on.

When the I/O cell 100 is operating in the ODT mode, the I/O cell 100 may provide resistor-linearized on-die termination as illustrated by the circuit 140. In the ODT mode, both a pull-up transistor 142 and a pull down transistor 148 may be switched on to create a Thevenin Equivalent Termination to one-half the supply voltage (e.g., VDDIO/2) with a resistance value of Rterm. For example, both the pull-up and pull-down paths may be implemented with an impedance of 2×Rterm (e.g., resistors 144 and 146), where 2×Rterm may range from about 80 ohms to about 300 ohms.

It would be desirable to use the same electrical elements (e.g., transistors and oxide-isolated poly resistors) to implement both the output driver function and the on-die termination. The elements would be controlled differently depending upon whether the driving mode was selected (e.g., operating as an output driver) or the terminating mode was selected (e.g., operating as a receiver or input driver). Using the same elements for both output driver function and ODT would reduce circuit area (cost) and pad-node-capacitance. Reducing pad-node-capacitance generally boosts performance (e.g., bandwidth) of the I/O.

In general, however, using the same elements for driver and ODT functions is not practical. Thevenin Equivalent Termination elements (transistors and resistors) need to sustain a great deal more DC voltage when conducting, and require a lot more attention from the standpoint of electromigration and poly resistor self-heating. For example, all the elements would need to be designed, from a standpoint of metal connecting the transistor to the power supply, the resistor to the transistor, and finally the resistor to the pad (I/O) node to sustain the very high currents associated with ODT. Similarly, all the poly resistor geometries would need to be designed with sufficient area to avoid self-heating when sustaining the higher voltages associated with termination.

The present invention generally implements both the pull-up and pull-down elements as binary-weighted networks. In order to achieve driver and termination impedances that (i) cover the desired range, (ii) allow for PVT compensation with the desired accuracy, and iii) have fine granularity of impedance settings, the driver network and ODT network may be implemented, in one example, as a 7-bit binary-weighted network. In a preferred embodiment, the present invention provides a 9-bit binary-weighted output driver where the top two bits are driver-capable and the bottom seven bits are ODT-capable.

Figure 5:
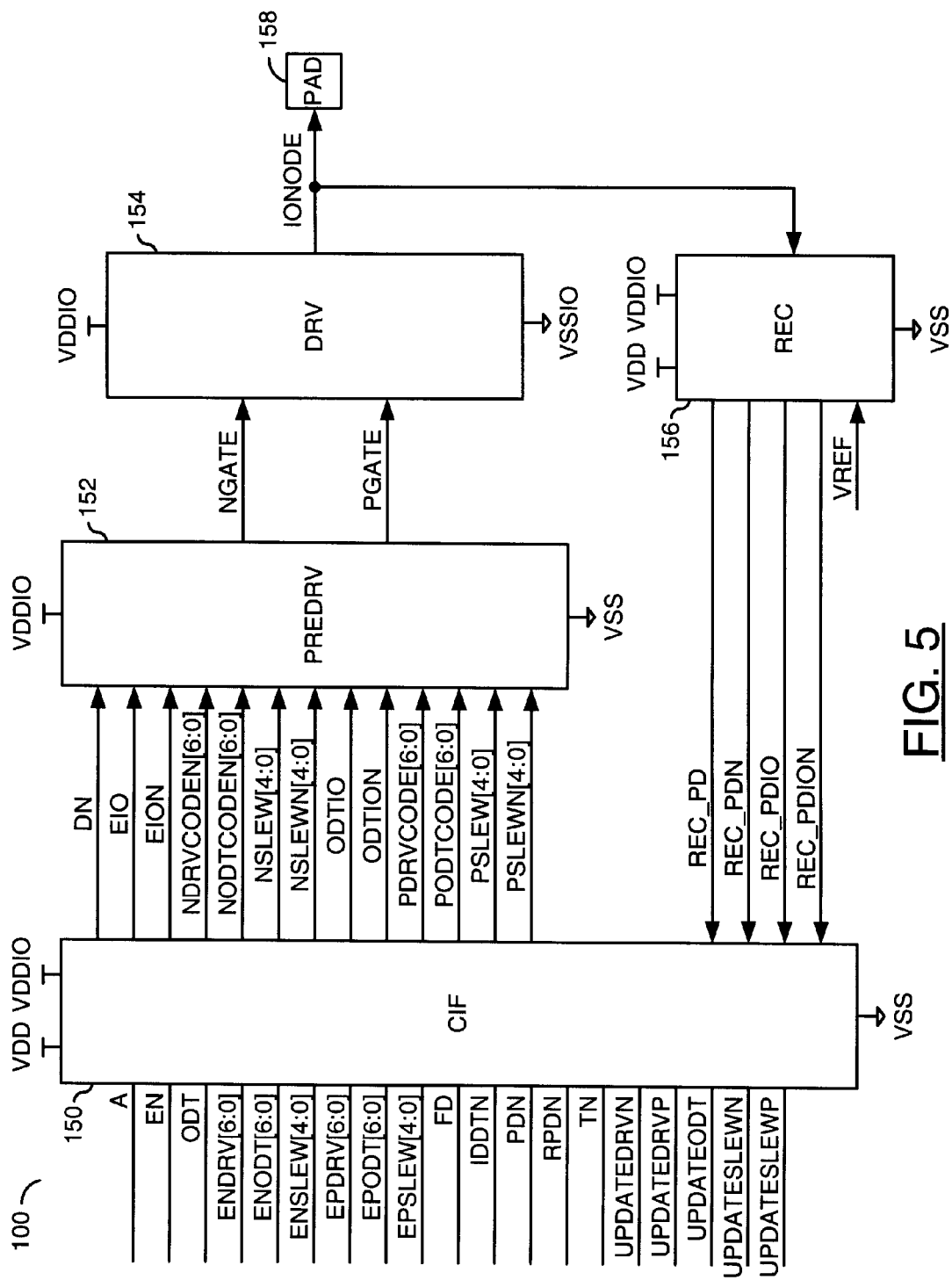
FIG. 5 is a diagram illustrating an input/output cell in accordance with a preferred embodiment of the present invention.

Referring to FIG. 5, a block diagram is shown illustrating a top view representation of the input/output cell 100 implemented in accordance with a preferred embodiment of the present invention. In one example, the I/O cell 100 may comprise a block 150, a block 152, a block 154 and a block 156. The block 150 may be implemented, in one example, as a core interface (CIF). The block 152 may be implemented, in one example, as a predriver. The block 154 may be implemented, in one example, as an output driver. The block 156 may be implemented, in one example, as a receiver block.

The block 150 may include, in one example, JTAG logic, level shifters and I/O power supply (VDDIO) domain buffers. The block 152 may comprise, in one example, a sequencer for driver/termination timing, a NAND-NOR tree and slew/di/dt control circuitry. The block 154 may comprise, in one example, a transistor/resistor network configured for merged driver/on-die termination (ODT) operations. The block 156 may include, in one example, an input receiver, a voltage reference (e.g., VREF) filter, a VDDIO-VDD level shifter and a receiver JTAG NAND tree.

The block 150 may be configured to operate in both the core power domain (e.g., VDD) and the I/O power domain (e.g., VDDIO). The block 150 may have a number of inputs that may receive a number of signals (e.g., A, EN, ODT, ENDRV, ENODT, ENSLEW, EPDRV, EPODT, EPSLEW, FD, IDDTN, PDN, RPDN, TN, UPDATEDRVN, UPDATEDRVP, UPDATEODT, UPDATESLEWN, AND UPDATESLEWP). The number of signals may further comprise a number of JTAG signals (not shown). The signal A may be implemented, in one example, as a data signal. The signal EN may be implemented, in one example, as a enable (or control) signal. The signal ODT may be implemented, in one example, as a control signal. In one example, the signal ODT may be configured to switch the I/O cell 100 in and out of the ODT mode.

The signals ENDRV, ENODT, ENSLEW, EPDRV, EPODT and EPSLEW may be configured to control (program) buffer and ODT operations of the I/O cell 100. The signals UPDATEDRVN, UPDATEDRVP, UPDATEODT, UPDATESLEWN, AND UPDATESLEWP may be configured to, in one example, latch the signals ENDRV, ENODT, ENSLEW, EPDRV, EPODT and EPSLEW during programming. The signal FD may be implemented as a test-mode signal that may tristate the output driver 154 when HIGH. The signal IDDTN may be implemented as a test mode signal for powering down the input receiver 156 and tristating the I/O pad 158. In one example, the signal IDDTN may comprise an input receiver/output driver active-low IDDQ test enable pin. The signal PDN may comprise an input control signal that may allow for power-down of the I/O cell 100, including output driver and input receiver. The signal RPDN may comprise an input control signal that may allow for power down of the input receiver while leaving the output driver active. The signal TN may comprise a global test-mode signal that may tristate all tristateable output drivers when, for example, in a low state.

The block 150 may have a number of outputs that may present a number of signals (e.g., DN, EIO, EION, NDRVCODEN, NODTCODEN, NSLEW, NSLEWN, ODTIO, ODTION, PDRVCODE, PODTCODE, PSLEW and PSLEWN) that may be presented to a number of inputs of the block 152. The signal DN may be implemented, in one example, as an output data signal. The signals EIO and EION may be implemented, in one example, as enable (or control) signals. The signals ODTIO and ODTION may be implemented, in one example, as control signals. In one example, the signals ODTIO and ODTION may be configured to switch the I/O cell 100 in and out of the ODT mode. The signals EIO, EION, ODTIO and ODTION may be level shifted up to the VDDIO supply voltage domain from the VDD supply voltage domain. The signals NDRVCODEN, NODTCODEN, NSLEW, NSLEWN, PDRVCODE, PODTCODE, PSLEW and PSLEWN may be configured to control (program) buffer and ODT operations of the I/O cell 100.

The block 152 may be configured to operate in the I/O power domain. The block 152 may have a first output that may present a signal (e.g., NGATE) and a second output that may present a signal (e.g., PGATE). The block 152 may be configured to generate the signals NGATE and PGATE in response to the signals DN, EIO, EION, NDRVCODEN, NODTCODEN, NSLEW, NSLEWN, ODTIO, ODTION, PDRVCODE, PODTCODE, PSLEW AND PSLEWN. The signals NGATE and PGATE may be implemented as, in one example, control signals. In one example, the signals NGATE and PGATE may be implemented as multi-bit signals. In another example, the signal NGATE and the signal PGATE may each be implemented as a plurality of individual signals.

The block 154 may be configured to operate in the I/O power domain. The block 154 may have a first input that may receive the signal NGATE, a second input that may receive the signal PGATE and an output the may present a signal (e.g., IONODE) to a pad 158. The block 154 may be configured to generate the signal IONODE in response to the signals NGATE and PGATE.

The block 156 may have an input that may receive a signal from the pad 158, an input that may receive a reference voltage (e.g., VREF) and a number of outputs that may present a number of signals (e.g., REC_PD, REC_PDN, REC_PD_IO and REC_PD_ION). The signals REC_PD, REC_PD_IO and REC_PD_IO_N may be implemented as control signals for powering down the block 156. The signals REC_PD_IO and REC_PD_IO_N are generally level-shifted up to the I/O supply voltage domain (e.g., VDDIO) from the core (VDD) supply voltage domain. For example, the signals REC_PD and REC_PD_IO are similar except that the signal REC_PD is under VDD core voltage levels and the signals REC_PD_IO and REC_PD_IO_N are under VDDIO voltage levels. The signals REC_PD and REC_PDN may be implemented as input data signals. The signals REC_PD_IO and REC_PD_IO_N may be configured to communicate information about a voltage level of the signal received by the block 156 from the pad 158. The block 156 may be configured to generate the signals REC_PD, REC_PDN, REC_PD_IO AND REC_PD_IO_N in response to the signal received from the pad 158 and the reference voltage VREF.

The present invention may provide a bidirectional I/O that supports the following 1.5V and 1.8V memory interface standards: QDR, DDR2, DDR3, and RLDRAM. All 1.5V/1.8V HSTL I/O requirements, and all 1.5V/1.8V SSTL I/O requirements. The output driver 154 may have an output driver impedance that is process, voltage, and temperature (PVT) compensated and can be electrically configured to any value ranging from about 18 ohms to about 72 ohms with fine granularity. In one example, the output driver 154 may provide an output driver impedance tolerance of +−10%. The term fine granularity as used herein generally means that any specified impedance value in a particular range can be targeted within, for example, 5%. The output driver impedance may be defined as |Idrive/Vpad| at Vpad=VDDIO/2. IN a preferred embodiment, the driver impedance when driving low (pull-down, or nmos) generally matches the driver impedance when driving high (pull-up, or pmos) within 10%.

When the I/O cell 100 is in the receive mode, the output driver 154 may be reconfigured as "Thevenin Equivalent Termination", or TET, to VDDIO/2. The configuration of the output driver 154 as Thevenin Equivalent Termination may also be referred to as "On-Die Termination", or ODT. When configured as ODT, the output driver 154 is simultaneously driving low and high. The pull-up and pull-down impedances in the ODT mode are generally defined the same as for the driver mode (e.g., |Idrive/Vpad| at Vpad=VDDIO/2), but the actual termination impedance is the parallel combination of the pull-up and pull-down impedances. The present invention provides a termination impedance that is process, voltage, and temperature compensated and may be electrically configured to any value ranging from, in one example, about 36 ohms to about 150 Ohms with fine granularity. In another example, the present invention provides a termination impedance that may be electrically configured to any value ranging from about 80 ohms to about 300 ohms with fine granularity. In a preferred embodiment, the present invention provides a termination impedance tolerance of +−10%.

In a preferred embodiment, the pull-up and pull-down output driver impedances, regardless of whether they are being used for transmit (driving) or for ODT, may be I-V linearized. The term I-V linearized as used herein generally means the impedance |Idrive/Vpad| measured at Vpad=20% VDDIO and the impedance |Idrive/Vpad| measured at Vpad=80% VDDIO do not vary from the impedance |Idrive/Vpad| measured at Vpad=VDDIO/2 by more than 10%.

The predriver 152 generally provides wave-shaping circuitry configured to control the output driver 154. The predriver 152 may be implemented having the following characteristics. Similar to the output driver 154, the predriver 152 is also electrically configurable, which allows for both slew rate control and for di/dt minimization. The predriver 152 may have a strength that may be set from about 1.5V 800 MHz capable (e.g., strongest predriver) all the way to about 1.8V 200 MHz capable (e.g., weakest predriver). In a preferred embodiment, the predriver strength may be configured from about 1.4V to about 1.9V. However, other ranges may be implemented accordingly to meet the design criteria of a particular implementation. The predriver 152 may also provide PVT compensation of the predrive strength. The predriver 152 implemented in accordance with the present invention may provide tighter output slew rate tolerance as well as minimizing di/dt for a particular peak operating frequency.

The predriver 152 may also include a dynamic ODT control circuit. The dynamic ODT control circuit may reconfigure the output driver 154 into Thevenin Equivalent Termination and vice versa. When the output driver 154 is disabled (e.g., in the receive mode), ODT may be turned ON or OFF with nearly identical timings to enable to I/O. The fast delay-matched ODT turn-on and turn-off permit power savings by turning off the ODT when termination is not being used. The I/O cell 100 generally provides very fast turn-around from drive mode to ODT-on receive mode. The built-in sequencer of the predriver 152 further may be configured to avoid excessive currents when switching between drive-mode and receive-mode.

The input receiver 156 generally has the following characteristics. The input receiver 156 may be configured to compare a voltage level of an input signal to an externally provided reference voltage (e.g., VREF). In one example, the reference voltage VREF may be set at one-half the I/O supply voltage (e.g., VDDIO/2). The input receiver 156 is generally capable of processing a wide range of input voltage swings (e.g., from +−200 mV to full rail-to-rail Vssio-VDDIO swing). The input receiver 156 may also comprise a built in filter on the reference voltage input.

Figure 6:
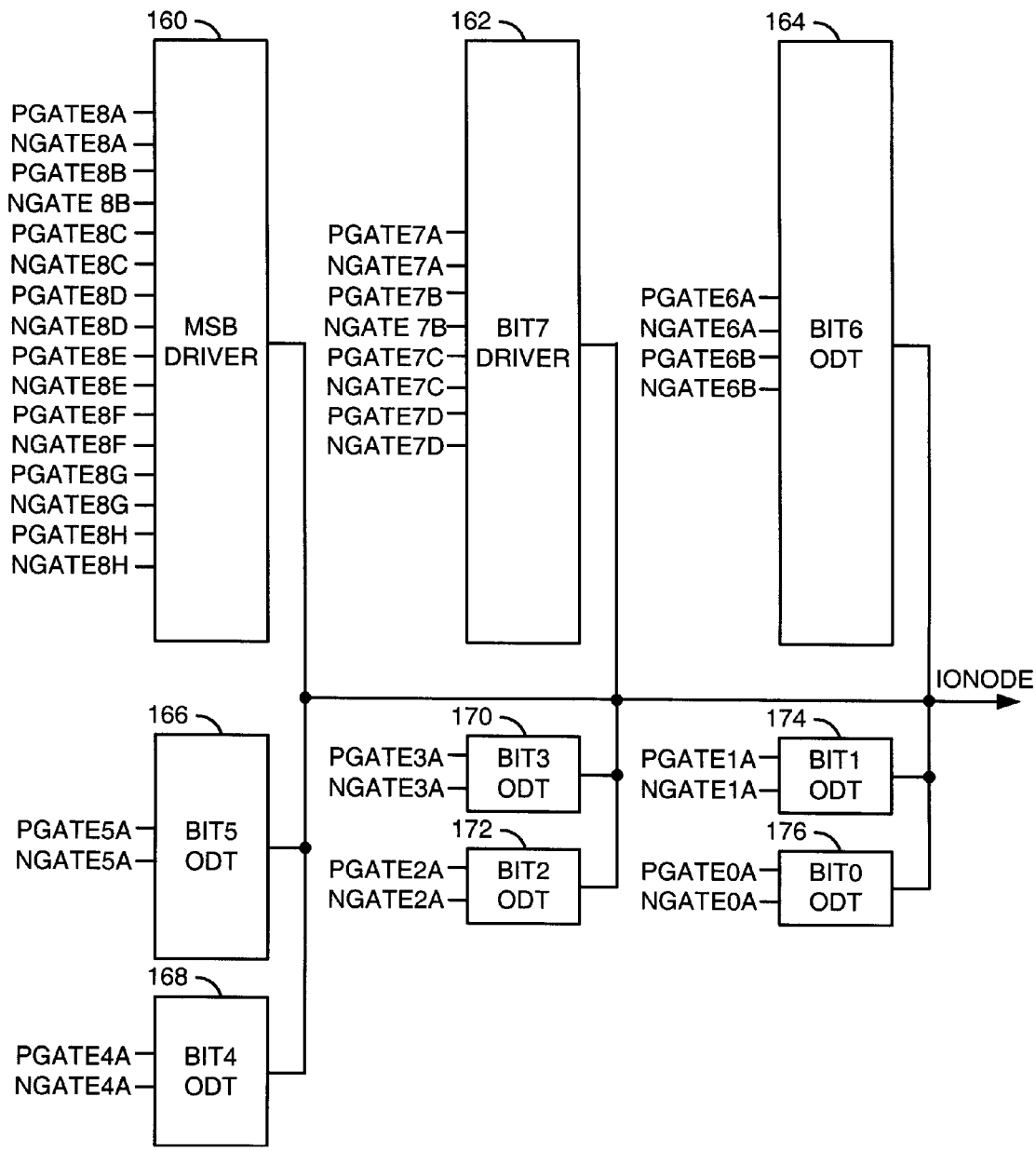
FIG. 6 is a diagram illustrating a 9-bit programmable output driver in accordance with a preferred embodiment of the present invention.

Referring to FIG. 6, a block diagram is shown illustrating an example implementation of the block 154 of FIG. 5. In one example, the block 154 may be implemented as a 9-bit binary-weighted driver/ODT circuit. However, other numbers of bits may be implemented accordingly to meet the design criteria of a particular implementation. In one example, the block 154 may comprise a block 160, a block 162, a block 164, a block 166, a block 168, a block 170, a block 172, a block 174 and a block 176. The block 160 may be implemented as a most significant bit driver. The block 162 may be implemented as a bit 7 driver. The block 164 may be implemented as a bit 6 driver. The block 166 may be implemented as a bit 5 driver. The block 168 may be implemented as a bit 4 driver. The block 170 may be implemented as a bit 3 driver. The block 172 may be implemented as a bit 2 driver. The block 174 may be implemented as a bit 1 driver. The block 176 may be implemented as a bit 0 driver. In one example, the total binary-weighted 9-bit output driver 154 may be implemented with the top two bits (e.g., the blocks 160 and 162), which provide ~¾ths of the drive strength, constructed from smaller driver-capable segments (described in more detail in connection with FIG. 8 below) and the bottom seven bits (e.g., the blocks 164-176) constructed from larger, higher resistance, ODT segments that are able to sustain higher voltages (described in more detail in connection with FIG. 9 below).

Each of the blocks 160-176 may be configured to generate a respective contribution to the signal IONODE. The block 160 may have a number of inputs that may receive a number of signals (e.g., PGATE8(A-H) and NGATE8(A-H)). The block 162 may have a number of inputs that may receive a number of signals (e.g., PGATE7(A-D) and NGATE7(A-D)). The block 164 may have a number of inputs that may receive a number of signals (e.g., PGATE6(A-B) and NGATE6(A-B)). The block 166 may have a pair of inputs that may receive a pair of signals (e.g., PGATE5A and NGATE5A). The block 168 may have a pair of inputs that may receive a pair of signals (e.g., PGATE4A and NGATE4A). The block 170 may have a pair of inputs that may receive a pair of signals (e.g., PGATE3A and NGATE3A). The block 172 may have a pair of inputs that may receive a pair of signals (e.g., PGATE2A and NGATE2A). The block 174 may have a pair of inputs that may receive a pair of signals (e.g., PGATE1A and NGATE1A). The block 176 may have a pair of inputs that may receive a pair of signals (e.g., PGATE0A and NGATE0A). The signals PGATE8(A-H), PGATE7(A-D), PGATE6(A-B), PGATE5A, PGATE4A, PGATE3A, PGATE2A, PGATE1A AND PGATE0A may be implemented as components of the signal PGATE. The signals NGATE8 (A-H), NGATE7 (A-D), NGATE6 (A-B), NGATE5A, NGATE4A, NGATE3A, NGATE2A, NGATE1A AND NGATE0A may be implemented as components of the signal NGATE.

Figure 7A:
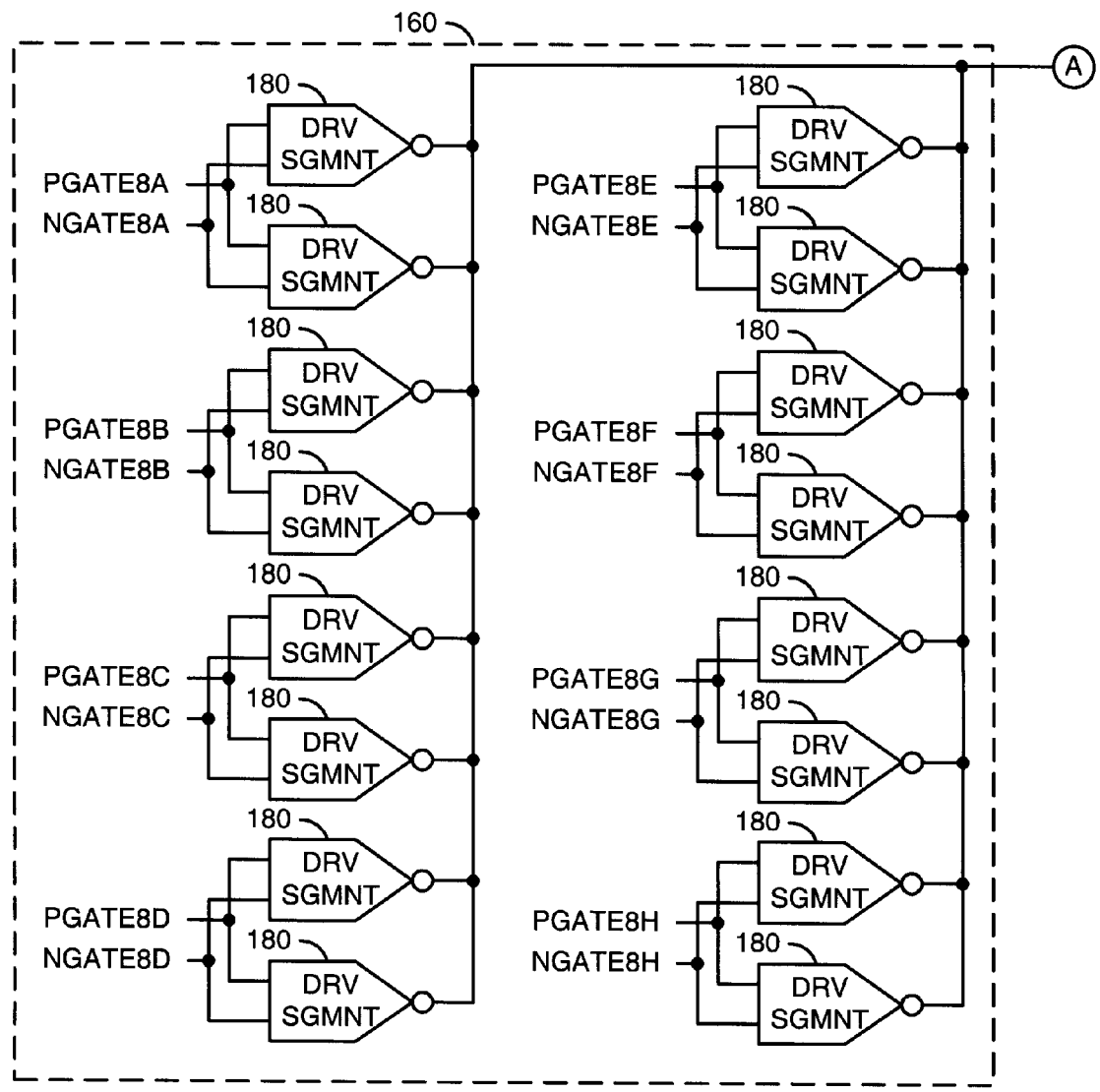
FIG. 7 is a diagram illustrating the 9-bit programmable output driver of FIG. 6 implemented with driver-capable segments and on-die termination (ODT) capable segments in accordance with a preferred embodiment of the present invention.
Figure 7B:
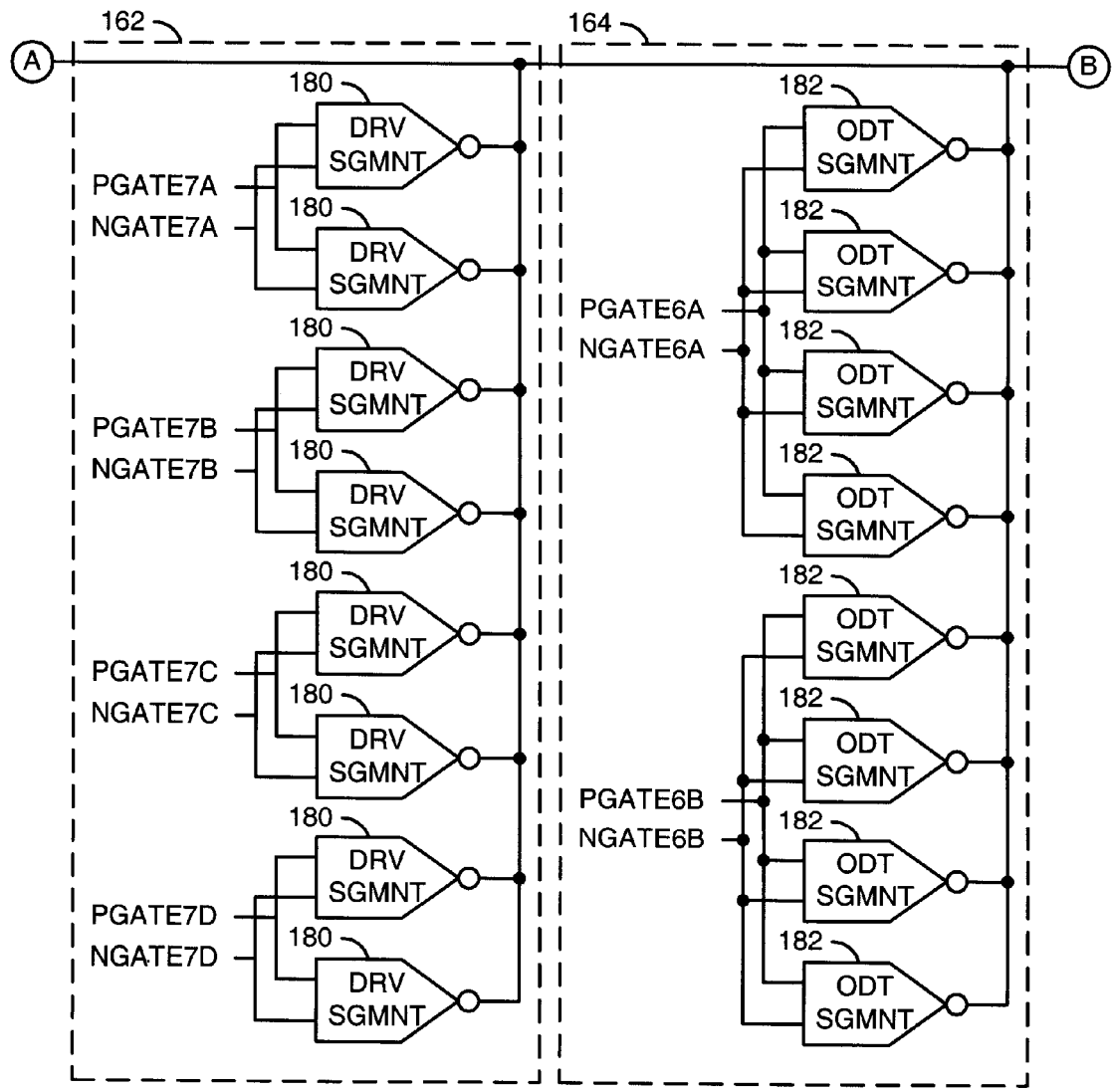
Figure 7C:
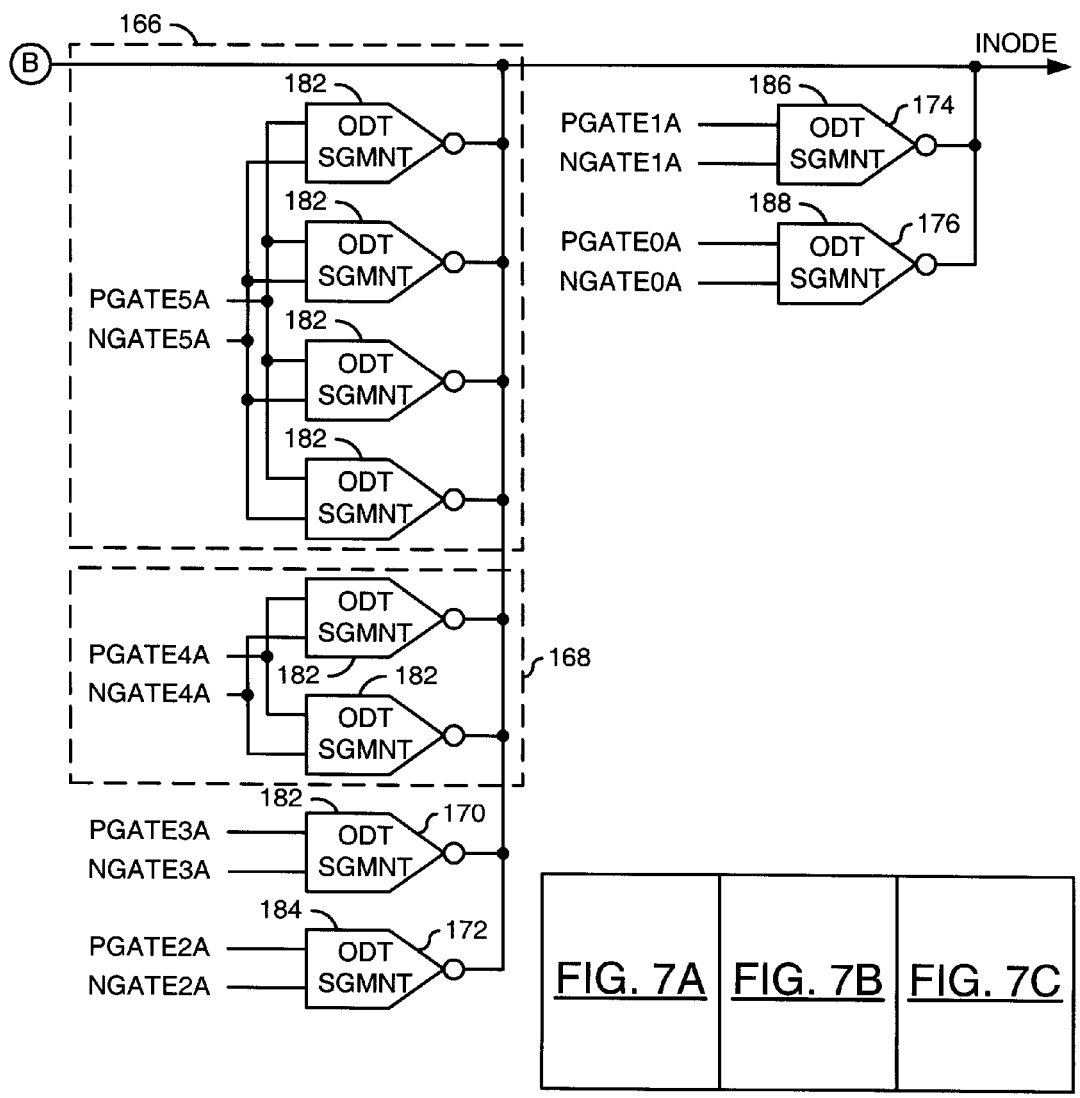

Referring to FIG. 7, a diagram is shown illustrating an example implementation of the block 154 of FIG. 6. The block 160 may comprise 16 driver-capable segments 180. Pairs of the driver-capable segments 180 may be connected in parallel with each pair being responsive to a respective set of the eight NGATE signals and eight PGATE signals (e.g., PGATE8A and NGATE8A, PGATE8B and NGATE8B, ..., PGATE8H and NGATE8H). The block 162 may comprise eight driver-capable segments arranged similarly to the block 160. For example, pairs of the eight driver-capable segments 180 may be connected in parallel with each pair being responsive to a respective set of the four NGATE signals and four PGATE signals (e.g., PGATE7A and NGATE7A, PGATE7B and NGATE7B, ..., PGATE7D and NGATE7D).

The block 164 may comprise eight ODT-capable segments 190. Groups of four of the ODT-capable segments 182 may be connected in parallel with each group being responsive to a respective set of the two NGATE signals and two PGATE signals (e.g., PGATE6A and NGATE6A and PGATE6B and NGATE6B). The block 166 may comprise four ODT-capable segments 182 connected in parallel and responsive to the signals PGATE5A and NGATE5A. The block 168 may comprise two ODT-capable segments 182 connected in parallel and responsive to the signals PGATE4A and NGATE4A. The block 170 may comprise one ODT-capable segment 182 and be responsive to the signals PGATE3A and NGATE3A. The block 172 may comprise and ODT-capable segment 184. The ODT capable segment 184 may be implemented, in one example, as one-half of an ODT-capable-segment 182. The ODT capable segment 184 may be responsive to the signals PGATE2A and NGATE2A. The block 174 may be implemented with an ODT-capable segment 186. The ODT-capable segment 186 may be responsive to the signals PGATE1A and NGATE1A. The block 176 may comprise an ODT-capable segment 188. The ODT-capable segment 188 may be responsive to the signals PGATE0A and NGATE0A.

Figure 8:
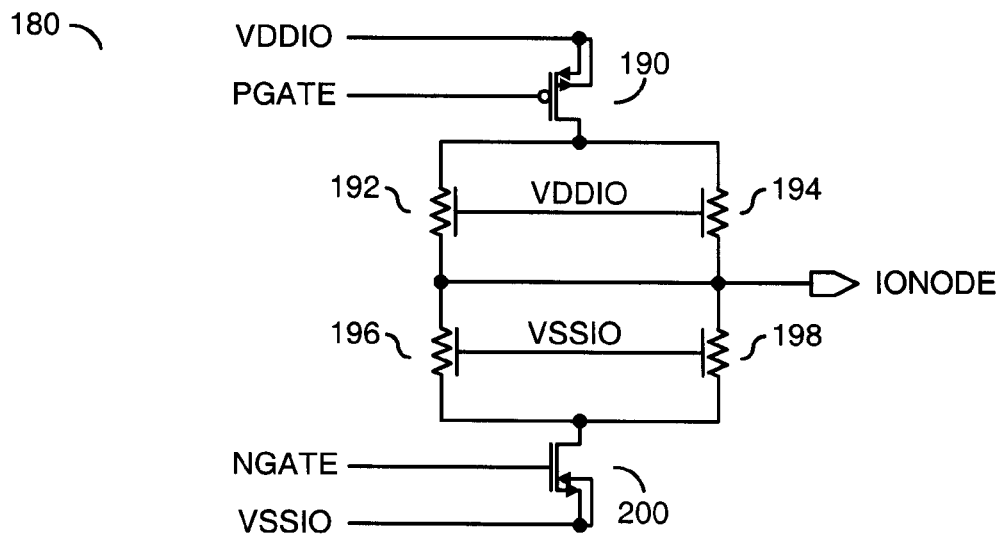
FIG. 8 is a diagram illustrating a driver-capable segment in accordance with the present invention.

Referring to FIG. 8, a diagram is shown illustrating an example driver-capable segment 180. In one example, the driver-capable segment 108 may be implemented with an impedance of about 576 ohms. The driver-capable segment 180 comprises a transistor 190, a resistor 192, a resistor 194, a resistor 196, a resistor 198 and a transistor 200. In one example, a source of the transistor 190 may receive the I/O supply voltage VDDIO, a gate of the transistor 190 may receive the signal PGATE, and a drain of the transistor 190 may be connected to a first terminal of the resistor 192 and a first terminal of the resistor 194. A second terminal of the resistor 192, a second terminal of the resistor 194, a first terminal of the resistor 196 and a first terminal of the resistor 198 may be connected together. A second terminal of the resistor 196 and a second terminal of the resistor 198 may be connected to a drain of the transistor 200. A gate of the transistor 200 may receive the signal NGATE and a source of the transistor 200 may be connected to a power supply ground potential (e.g., VSSIO). In one example, the resistors 192, 194, 196 and 198 may be implemented as, in one example, oxide-isolated poly resistors.

Figure 9:
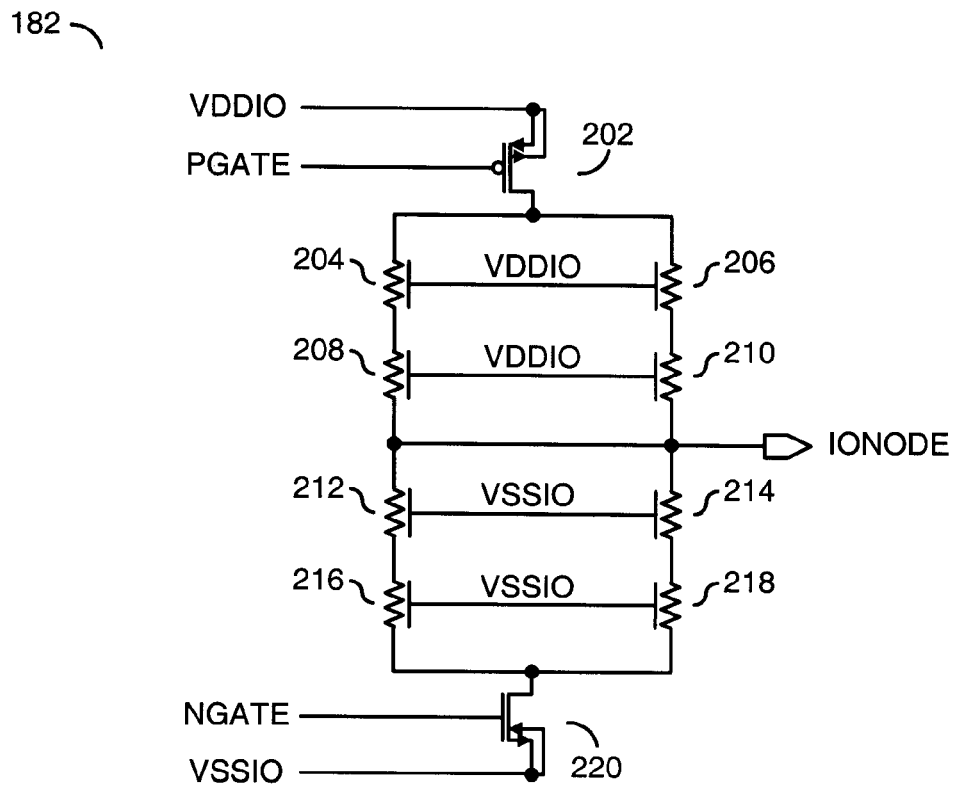
FIG. 9 is a diagram illustrating an ODT-capable segment in accordance with the present invention.

Referring to FIG. 9, a diagram is shown illustrating an example ODT-capable segment 182. In one example, the ODT-capable segment 182 may be implemented with an impedance of about 1,152 ohms. In general, the ODT-capable segment 182 may be implemented with twice the resistance and twice the poly area compared with the driver-capable segment 180. The larger resistance and area may reduce the power density (e.g., by a factor of 4). The ODT-capable segment 182 generally comprises a transistor 202, a resistor 204, a resistor 206, a resistor 208, a resistor 210, a resistor 212, a resistor 214, a resistor 216, a resistor 218 and a transistor 220. In one example, the resistors 204, 206, 208, 210, 212, 214, 216 and 218 may be implemented as oxide-isolated poly resistors.

In one example, a source of the transistor 202 may receive the I/O supply voltage VDDIO, a gate of the transistor 202 may receive the signal PGATE, and a drain of the transistor 202 may be connected to a first terminal of the resistor 204 and a first terminal of the resistor 206. A second terminal of the resistor 204 may be connected to a first terminal of the resistor 208. A second terminal of the resistor 206 may be connected to a first terminal of the resistor 210. A second terminal of the resistor 208, a second terminal of the resistor 210, a first terminal of the resistor 212 and a first terminal of the resistor 214 may be connected together. A second terminal of the resistor 212 may be connected to a first terminal of the resistor 216. A second terminal of the resistor 214 may be connected to a first terminal of the resistor 218. A second terminal of the resistor 216 and a second terminal of the resistor 218 may be connected to a drain of the transistor 220. A gate of the transistor 220 may receive the signal NGATE and a source of the transistor 220 may be connected to an I/O power supply ground potential (e.g., VSSIO).

Comparing the ODT-capable segments 182 with driver-capable segments 180, the ODT-capable segments 182 are precisely 2×, 4×, or 8× the resistance of the driver-capable segments 180 while dramatically increasing the poly area to avoid self-heating of the resistors. Providing 2×, 4×, or 8× the resistance of the driver-capable segments while dramatically increasing the poly area is done by going from two parallel resistors for the driver-capable segment 180 to two series, two parallel, resistors with half the mosfet width for the ODT-capable segment 182.

Figures 10, 11:
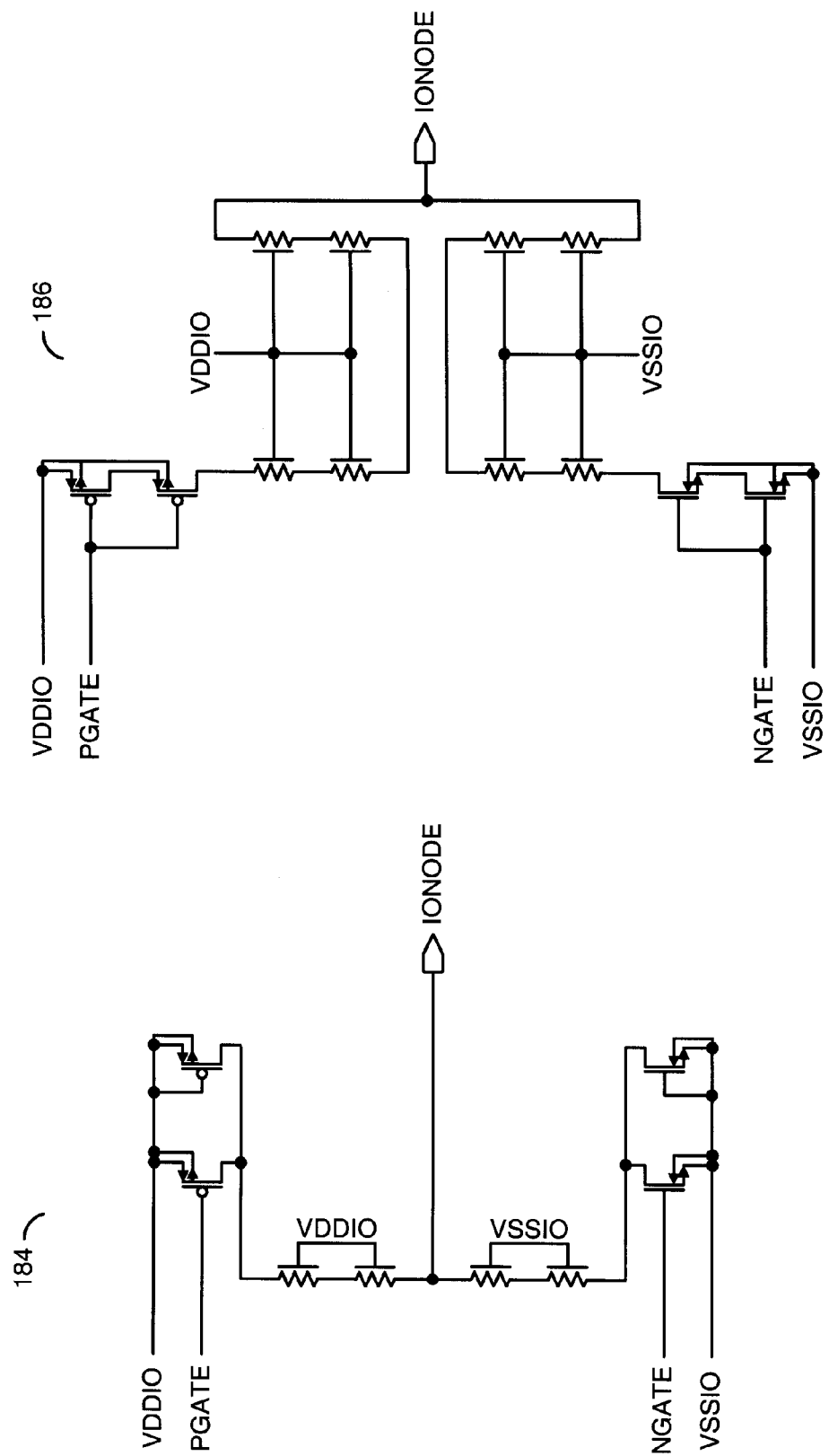
FIG. 10 is a diagram illustrating an example of an ODT-capable segment used to implement bit 2 of the output driver of FIG. 7.
FIG. 11 is a diagram illustrating an example of an ODT-capable segment used to implement bit 1 of the output driver of FIG. 7.

Referring to FIG. 10, a diagram is shown illustrating an example implementation of the ODT-capable segment 184 used to implement the bit 2 driver element. In one example, the ODT-capable segment 184 may be constructed out of series elements similar to the ODT-capable segment 182. In one example, the ODT-capable segment 184 may be implemented having an impedance of about 2,304 ohms. No long channels or very narrow width transistors are generally implemented. Some small scaling error due to body effect in the transistors may result. The ODT-capable segment 184 generally has one of the field effect transistors (FETs) tied off and only uses two resistors per side. The ODT-capable segment 184 generally has a two times higher impedance than the ODT-capable segment 182.

Referring to FIG. 11, a diagram is shown illustrating an example implementation of the ODT-capable segment 186 used to implement the bit 1 element. In one example, the ODT-capable segment 186 may be constructed out of series elements similar to the ODT-capable segment 184. In one example, the ODT-capable segment 186 may have an impedance of about 4,608 ohms. No long channels or very narrow width transistors are generally implemented. Some small scaling error due to body effect in the transistors may result. The ODT-capable segment 186 generally comprises two series field effect transistors (FETs) and four series resistors per side. The ODT-capable segment 186 generally has a four times higher impedance than the ODT-capable segment 182.

Figure 12:
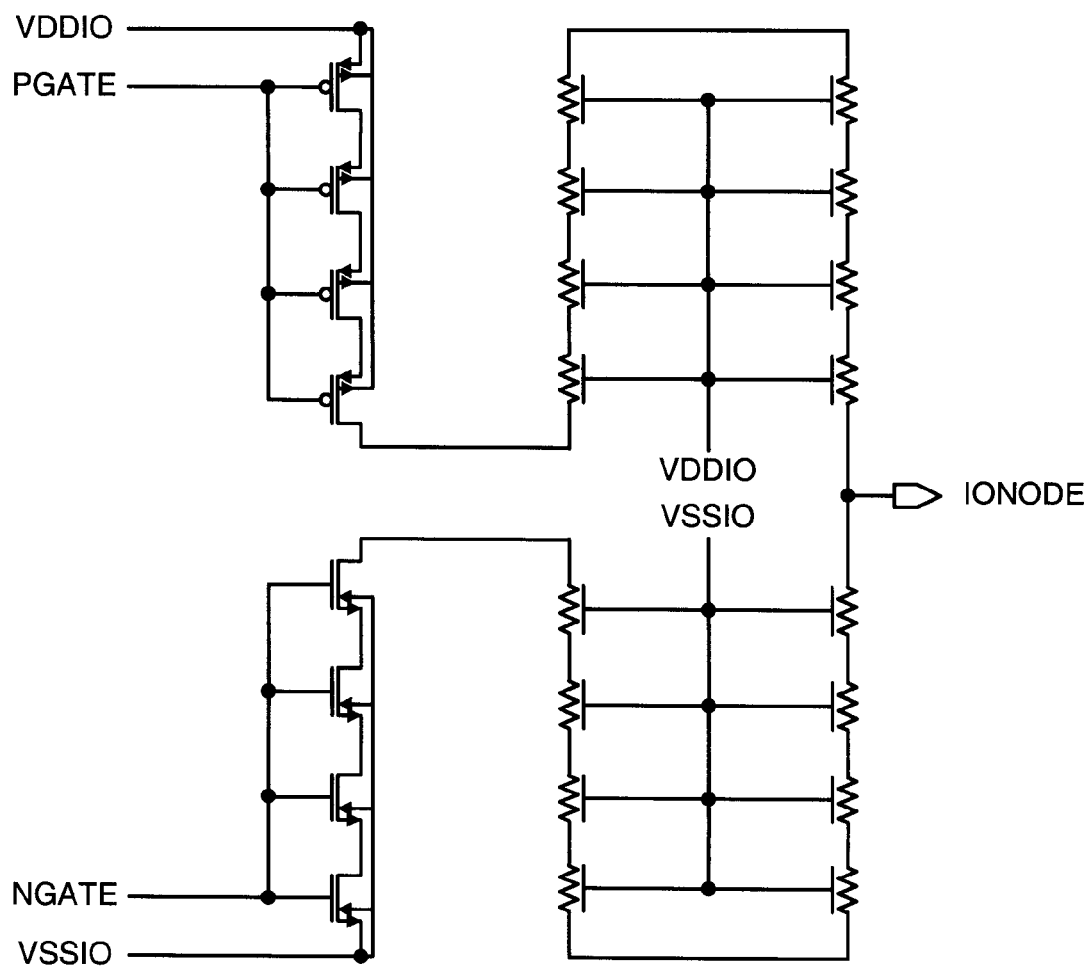
FIG. 12 is a diagram illustrating an example of an ODT-capable segment used to implement bit 0 of the output driver of FIG. 7.

Referring to FIG. 12, a diagram is shown illustrating an example implementation of the ODT-capable segment 188 used to implement the bit 0 element. In one example, the ODT-capable segment 188 may be constructed out of series elements similar to the ODT-capable segment 186. In one example, the ODT-capable segment 188 may have an impedance of about 9,216 ohms. No long channels or very narrow width transistors are generally implemented. Some small scaling error due to body effect in the transistors may result. The ODT-capable segment 188 generally comprises four series FETs and eight series resistors per side. The ODT-capable segment 188 generally has a eight times higher impedance than the ODT-capable segment 182.

Figure 13:
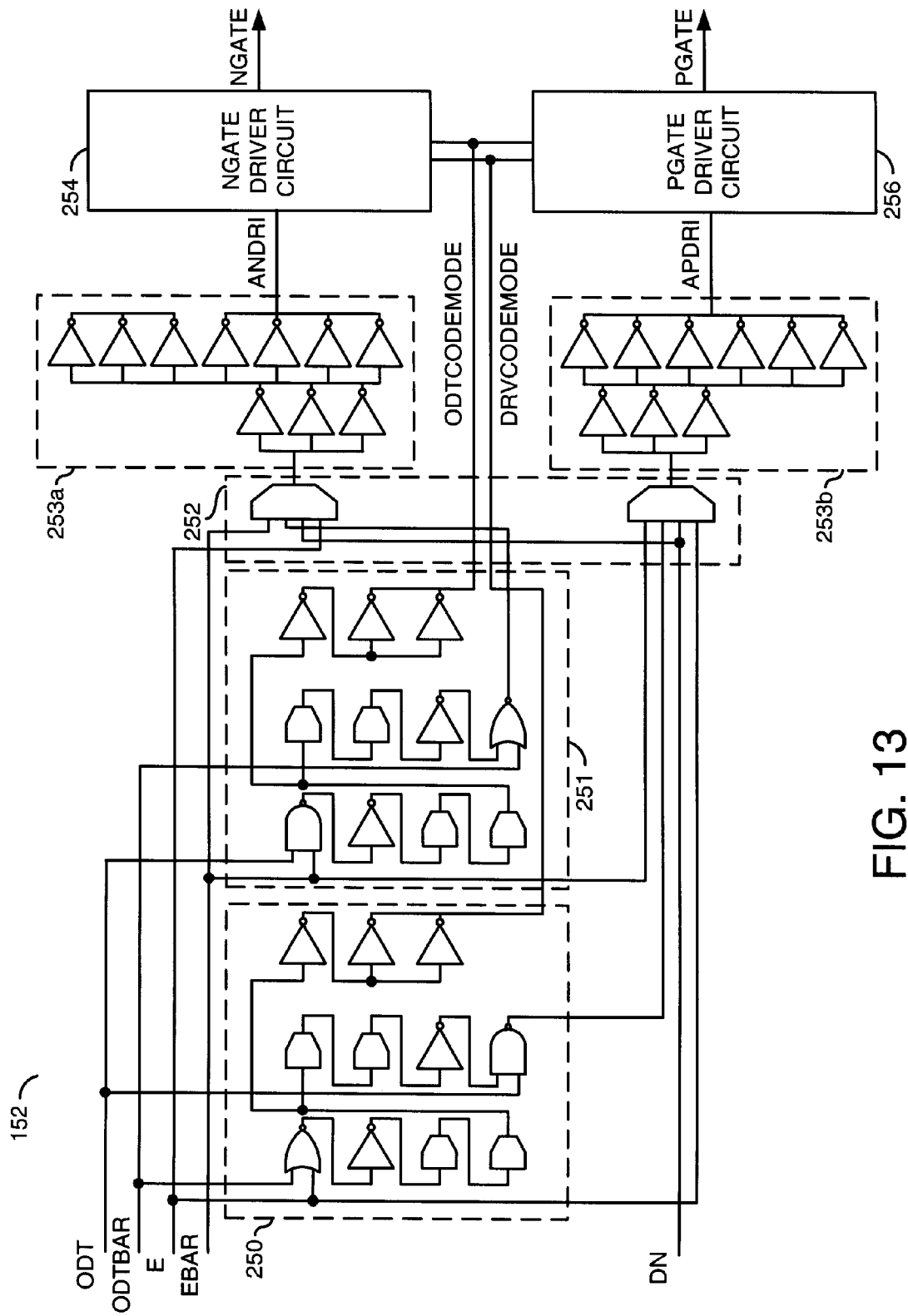
FIG. 13 is a diagram illustrating an example implementation of a predriver circuit in accordance with the present invention.
Figure 14:
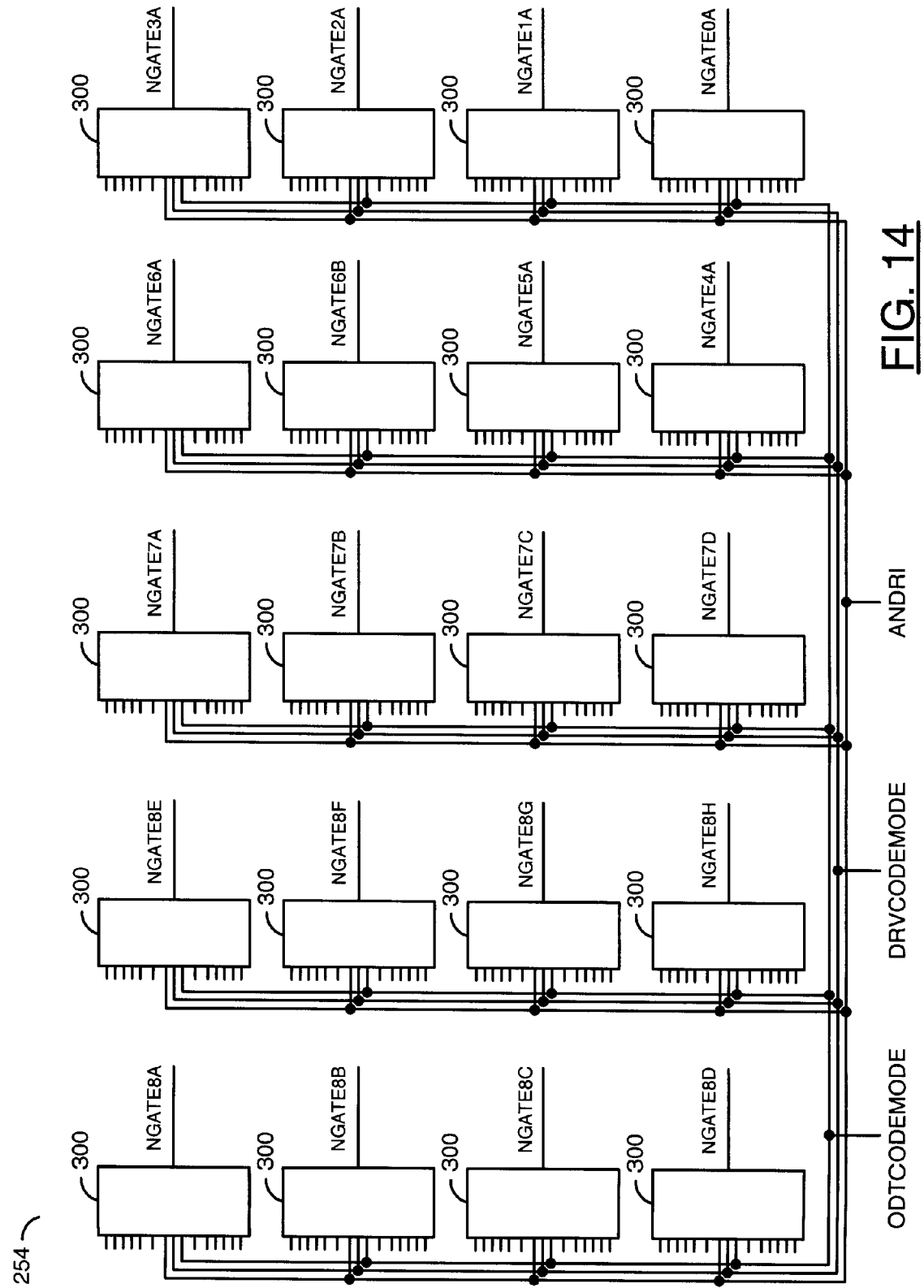
FIG. 14 is a diagram illustrating an example of an ngate driver circuit of FIG. 13 implemented with twenty ngate drivers.
Figure 15:
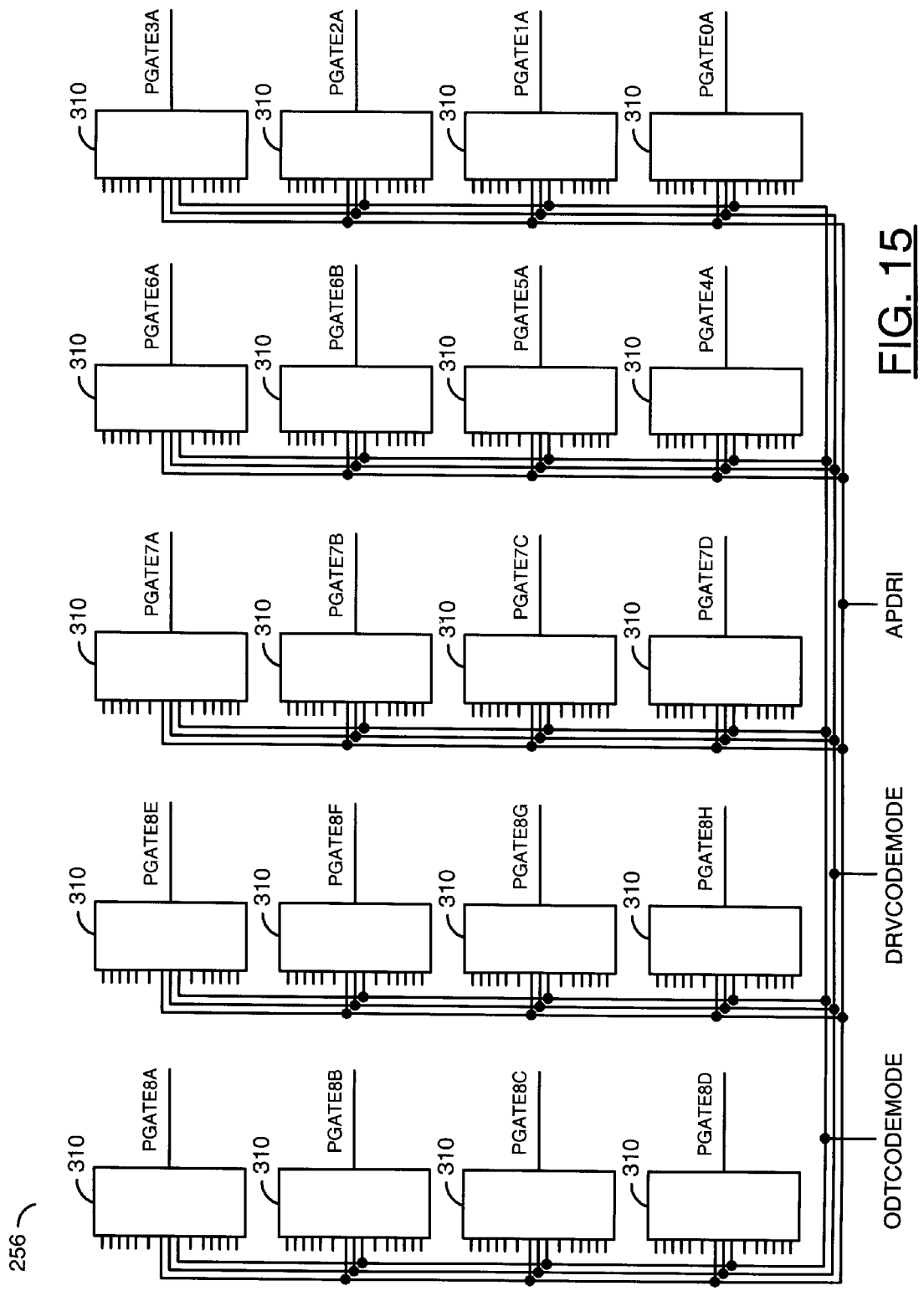
FIG. 15 is a diagram illustrating an example of a pgate driver circuit of FIG. 13 implemented with twenty pgate drivers.

Referring to FIG. 13, a block diagram is shown illustrating an example implementation of the block 152 of FIG. 5 in accordance with a preferred embodiment of the present invention. The block 152 may comprise a data enable logic and driver-ODT sequencer (or front end). In one example, the block 152 may comprise a NOR-NAND tree 250 and a NAND-NOR tree 251, a driver/ODT sequencer 252, buffering networks (or inverter trees) 253a and 253b, an ngate driver block 254 and a pgate driver block 256. The blocks 253a and 253b generally provide buffering for the multiplexer 252 output signals. The buffering generally provides delay and delay matching between the two paths. The NOR-NAND tree 250 and the NAND_NOR tree 251 generally comprise a number of NOR-, NAND-, inverter and non-inverter gates. In one example, the ngate driver block 254 may be implemented with twenty 5-bit adjustable ngate drivers 300 (see FIG. 14) and the pgate driver block 256 may be implemented with twenty 5-bit adjustable pgate drivers 310 (see FIG. 15).

The sequencer 252 is implemented as part of the predriver 152 and, therefore, generally tracks the predriver 152 with process, voltage and temperature. In one example, when the signal ODT is set to a logic 0 or LOW state and the signal ODTBAR is set to a logic 1 or HIGH state, the driver 154 may be disabled by setting the signals NGATE to a logic 0 (or LOW) and setting the signals PGATE to a logic 1 (or HIGH). When the signal ODT is a logic 1 or HIGH and the signal ODTBAR is a logic 0 or LOW, the driver 154 may be disabled by first setting the signals NGATE to a logic 0 (or LOW) and setting the signals PGATE to a logic 1 (or HIGH), and then the switching the codes around for simultaneous pull-up and pull-down turn-on.

The sequencer block 252 may be set such that the codes loaded into the driver 154 depend upon the signals EN and ODT. Determining the codes loaded into the driver 154 based upon the signals EN and ODT generally allows valid data transmission with a HIGH to LOW transition of the signal EN. However, a turn on time of the ODT mode based upon the signal ODT may be similar to ODT turn on based upon the signal EN. The block 152 generally provides (i) a means for driving out the correct data state at the correct impedance on the first cycle when the signal EN transitions HIGH-to-LOW, (ii) a means for dynamic ODT control and (iii) a sequencer so that when ODT=1 only EN is used to change the direction of data flow. The block 152 allows for safely turning ODT on and off in a reasonable amount of time. Safely means that the pull-up and pull-down are not both on while the driver is configured with driver codes rather than ODT codes.

Figure 16:
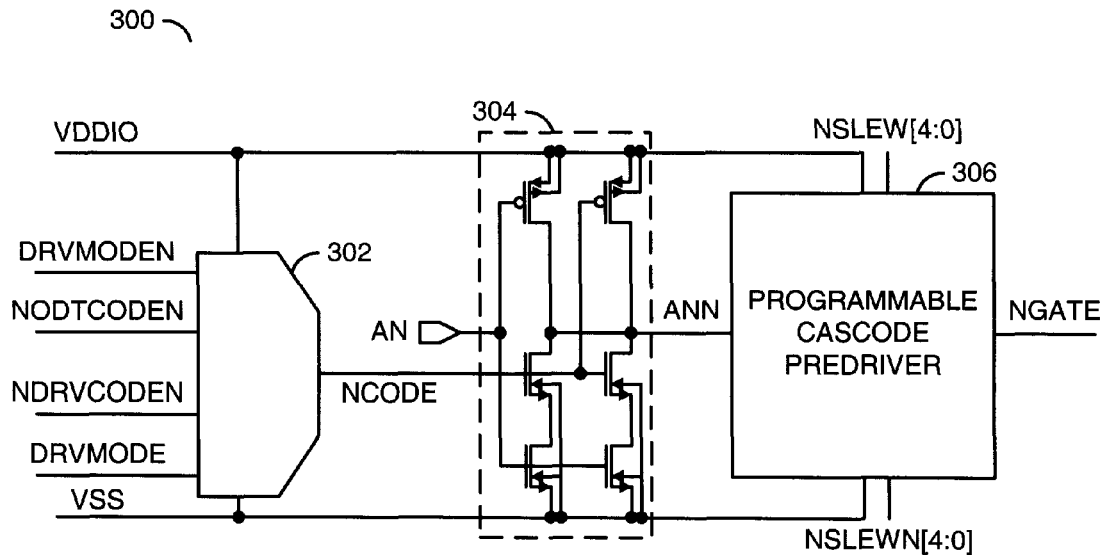
FIG. 16 is a diagram illustrating an example of an adjustable ngate driver circuit in accordance with the present invention.

Referring to FIG. 16, a diagram is shown illustrating an example unit ngate driver 300 in accordance with the present invention. The unit ngate driver 300 generally comprises a code multiplexer 302, a NAND data path 304 and a programmable cascode predriver 306. The code multiplexer 302 is generally configured to select between driver and ODT codes (modes). The data path NAND gate 304 generally combines a data signal (e.g., AN) with driver or ODT code information (e.g., NCODE). The signal AN is generally based on the signals A and EN. The programmable cascode predriver 306 may be implemented as, in one example, a 5-bit digital-to-current (D-I) converter. The D-I converter may provide slew rate and/or di/dt control (e.g., by controlling a rate of turn-on and turn-off of the n-channel driver gate).

Figure 17:
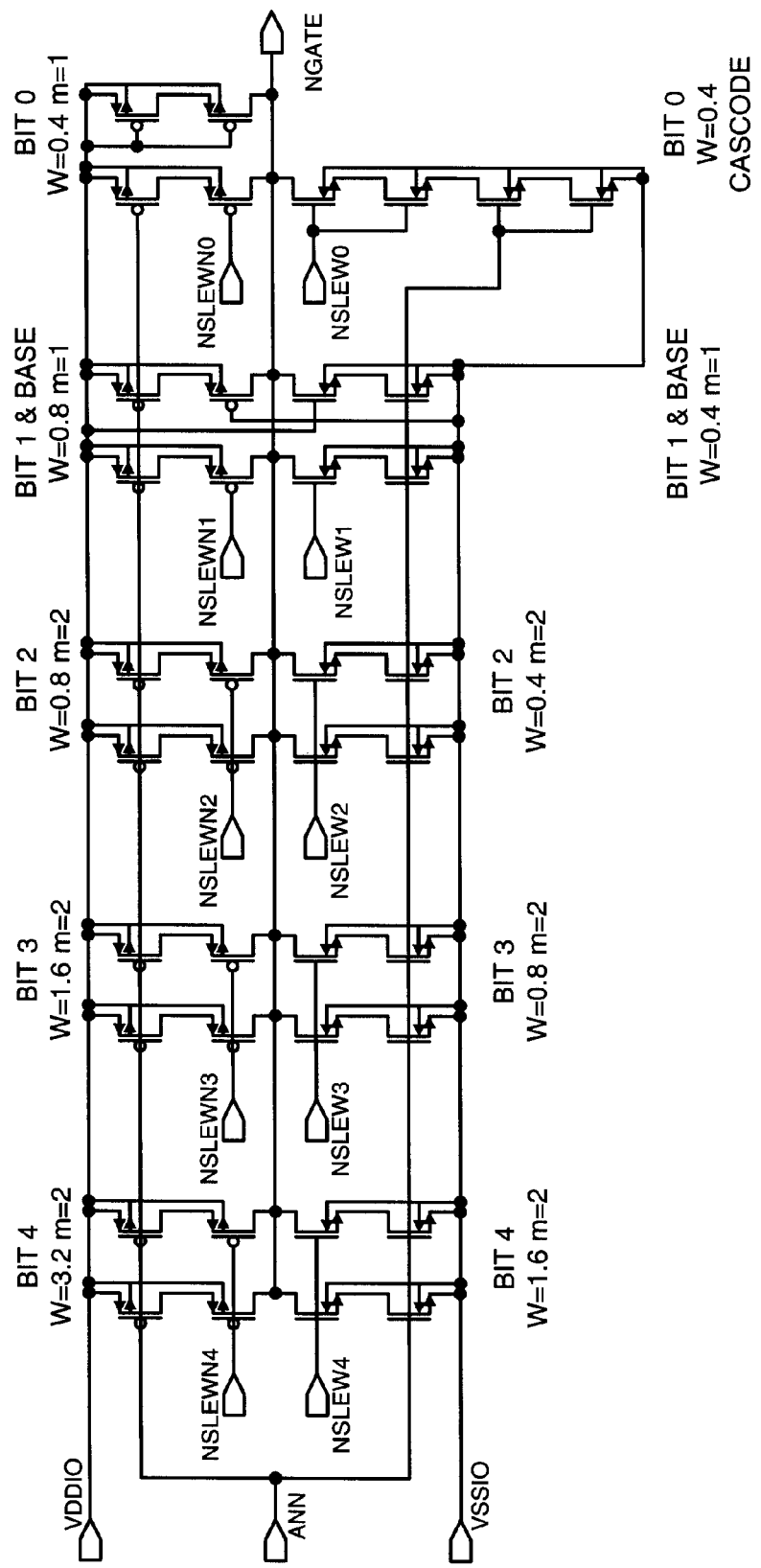
FIG. 17 is a diagram illustrating an example of a 5-bit implementation of the programmable cascode predriver of FIG. 16.

Referring to FIG. 17, a diagram is shown illustrating an example implementation of the programmable cascode predriver 306. In one example, programmable cascode predriver 306 may be implemented as a 5-bit D-I converter configured to adjust slew rate in response to the signals NSLEW[4:0] and NSLEWN[4:0].

Figure 18:
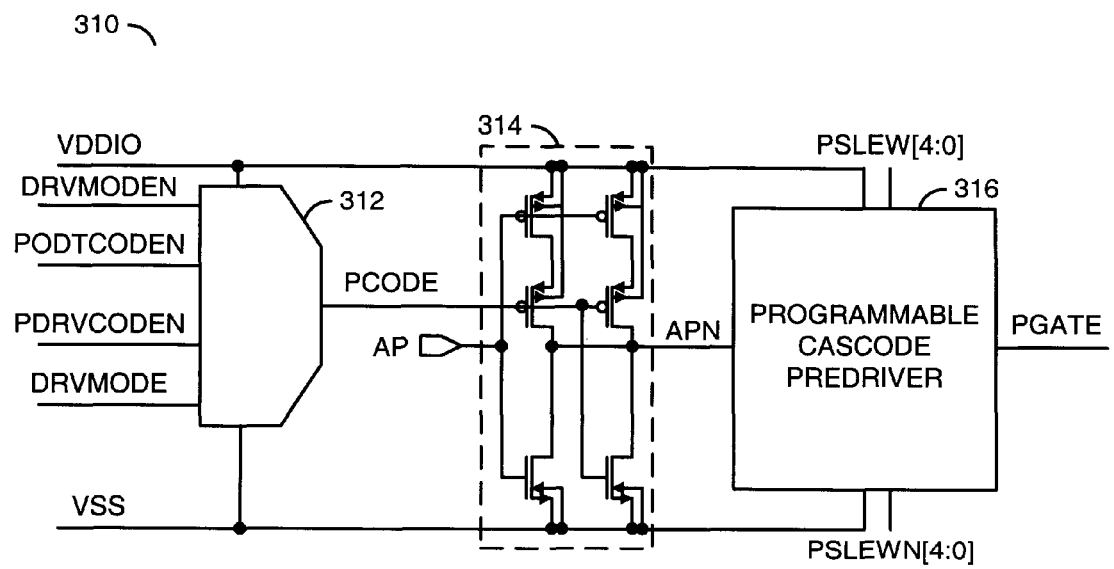
FIG. 18 is a diagram illustrating an example of an adjustable pgate driver circuit in accordance with the present invention.

Referring to FIG. 18, a diagram is shown illustrating an example unit pgate driver 310. The unit pgate driver 310 generally comprises a code multiplexer 312, a NOR data path 314 and a programmable cascode predriver 316. The code multiplexer 312 is generally configured to select between driver and ODT codes (modes). The data path NOR gate generally combines a data signal (e.g., AP) with driver or ODT code information (e.g., PCODE). The signal AP is generally based on the signals A and EN. The programmable cascode driver 316 may be implemented as, in one example, a 5-bit digital-to-current (D-I) converter. The D-I converter may provide slew rate and/or di/dt control (e.g., by controlling a rate of turn-on and turn-off of the p-channel driver gate).

Figure 19:
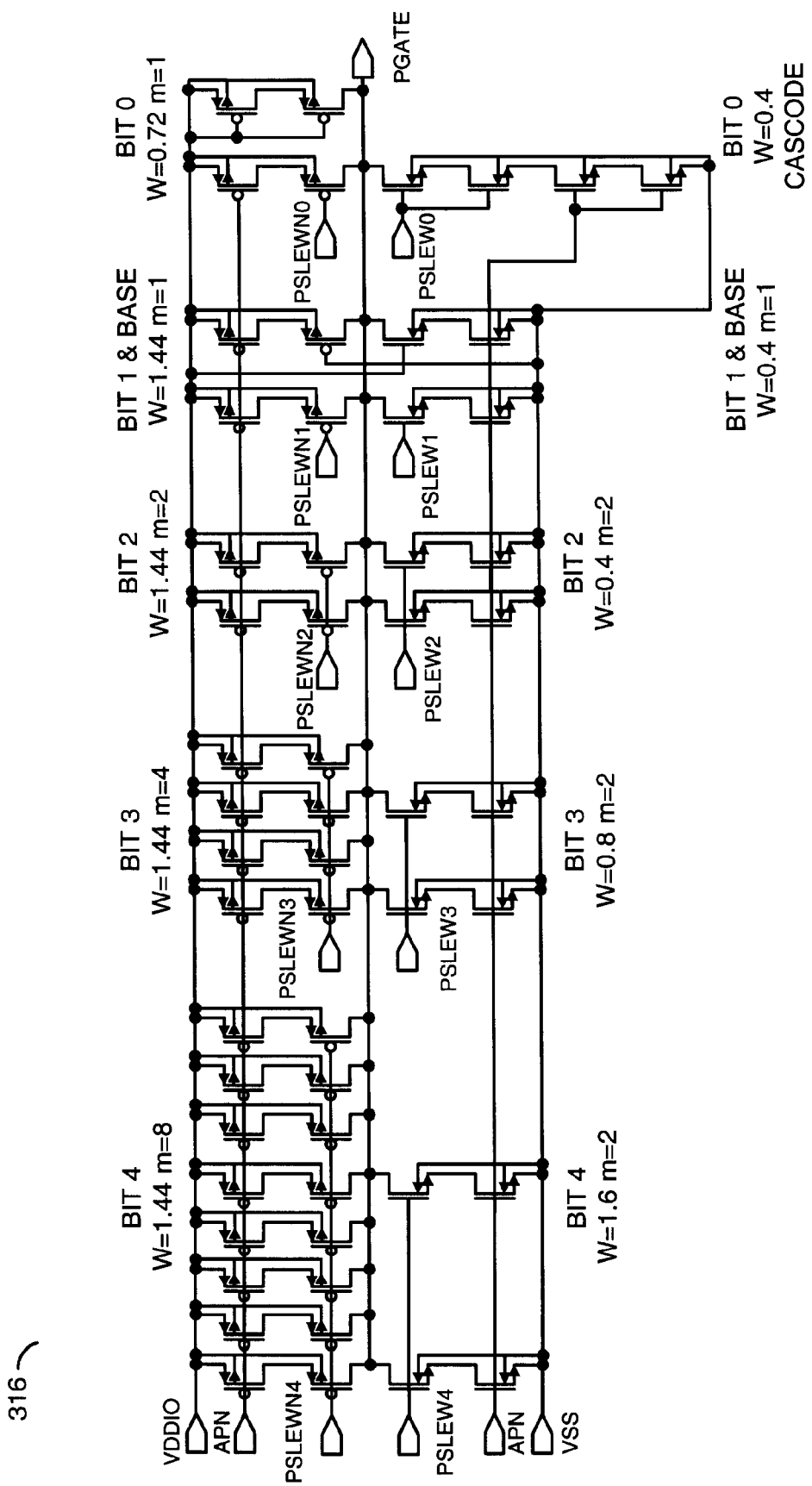
FIG. 19 is a diagram illustrating an example of a 5-bit implementation of the programmable cascode predriver of FIG. 18.

Referring to FIG. 19, a diagram is shown illustrating an example implementation of the programmable cascode predriver 316. In one example, programmable cascode predriver 316 may be implemented as a 5-bit D-I convertor configured to adjust slew rate in response to the signals PSLEW[4:0] and PSLEWN[4:0].

Figure 20:
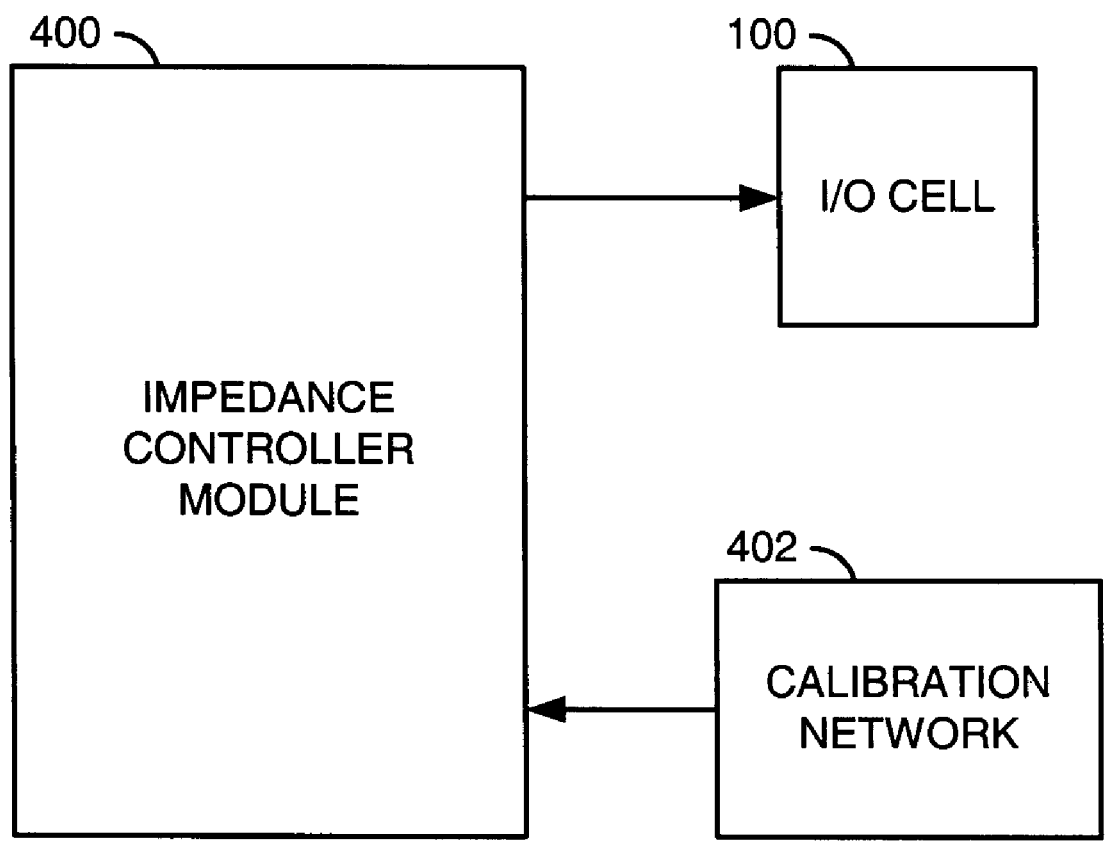
FIG. 20 is a diagram illustrating an impedance controller and calibration network connected to the I/O buffer in accordance with the present invention.

Referring to FIG. 20, a diagram is shown illustrating an impedance controller 400 and calibration network (or reference cell) 402 in accordance with a preferred embodiment of the present invention. The impedance controller 400 and the calibration network 402 may be implemented as a separate cell (or cells) from the I/O cell 100. In conjunction with the calibration network 402, the impedance controller module 400 generally provides buffer output drive impedance, the ODT termination impedance and the slew-rate/pre-driver impedance information to the I/O cell 100.

Figure 21:
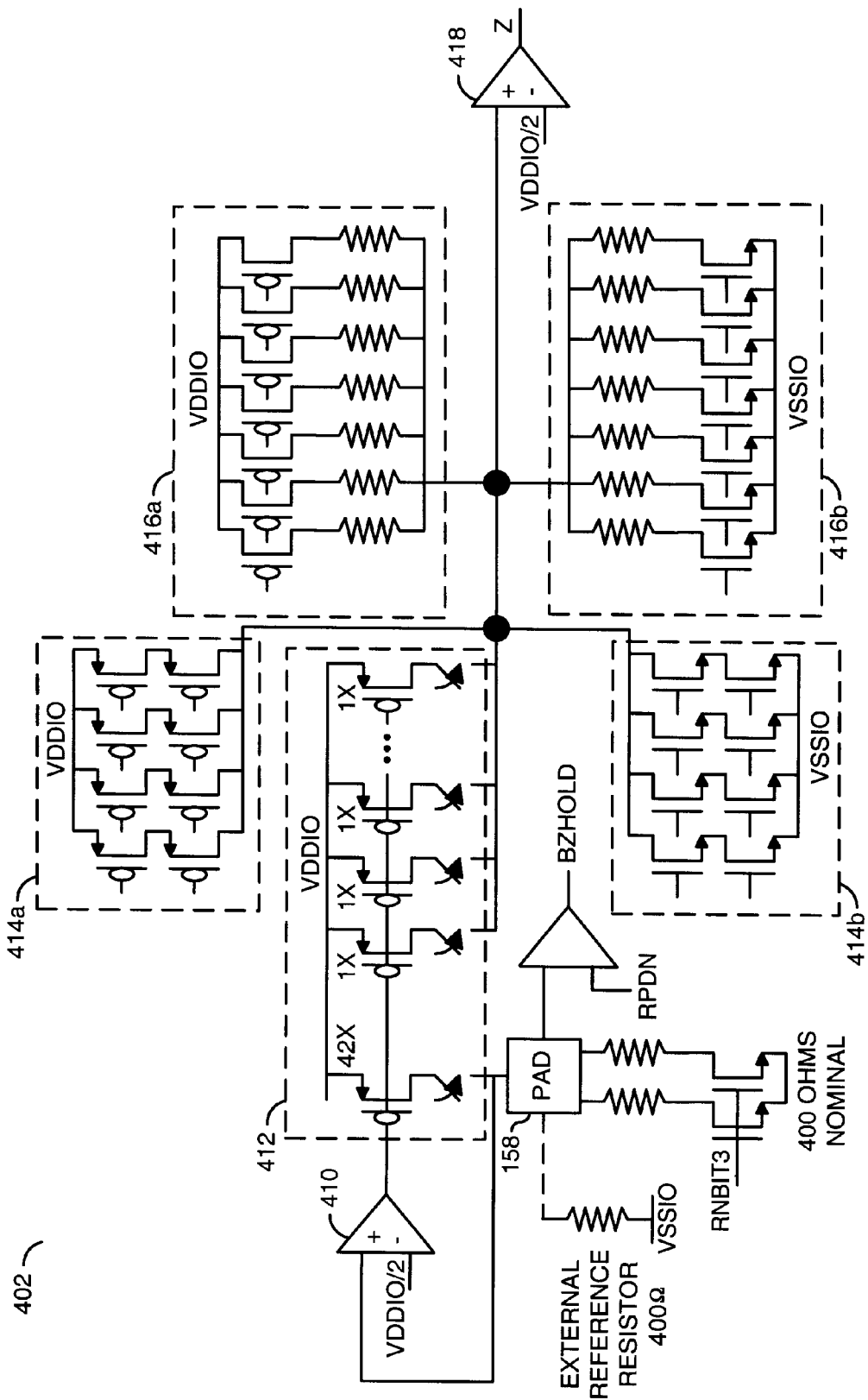
FIG. 21 is a diagram illustrating a reference cell slew calibration network in accordance with the present invention.

Referring to FIG. 21, a diagram is shown illustrating an example ODT calibration and slew calibration network of the reference cell 402. The ODT and slew calibration networks in the reference cell 402 are generally implemented as 7-bit rather than 5-bit networks. The top 5 bits may be sent to the input/output cell 100 although some precision may be lost by sending 5 bits instead of 7 bits. The present invention generally provides a precision network that may be used with other circuits. The ODT and slew calibration networks may be used to determine where in PVT space the n-channel and p-channel cascodes are located. The network design generally avoids narrow width PMOS as much as possible.

In one example, the calibration network 402 may comprise a block (or circuit) 410, a block (or circuit) 412, a block (or circuit) 414a, a block (or circuit) 414b, a block (or circuit) 416a, a block (or circuit) 416b, a block (or circuit) 418. The block 410 may be implemented, in one example, as an operational amplifier (op amp). The block 412 may be implemented, in one example, as a 7-bit (0-127) current steering digital-to-analog converter (DAC). The block 414a may be implemented, in one example, as a 7-bit (0-127) PMOS slew network. The block 414b may be implemented, in one example, as a 7-bit (0-127) NMOS slew network. In one example, the blocks 414a and 414b may comprise transistor only cascode pairs. The block 416a may be implemented, in one example, as a 7-bit (0-127) half PMOS ODT network. The block 416b may be implemented, in one example, as a 7-bit (0-127) half NMOS ODT network. The block 418 may be implemented, in one example, as a comparator.

In one example, the blocks 414a and 414b may have a worse case impedance of about 100 ohms. The blocks 416a and 416b may be implemented, in one example, as replicas of the pad ODT networks cut in half by eliminating the most significant bit (MSB) and adding a least significant bit (LSB). In one example, blocks 416a and 416b may be implemented with approximately 16 segments. In one example, the bits of the blocks 416a and 416b may be weighted (e.g., $4+2+1+\frac{1}{2}+\frac{1}{4}+\frac{1}{8}+\frac{1}{16}$).

The pad 158 may be connected to a non-inverting input of the block 410. An inverting input of the block 410 may receive a reference voltage. In one example, the reference voltage may be approximately one-half the I/O voltage supply (e.g., VDDIO/2). The pad 158 may be tied to VSSIO via an external resistor. In one example, the external resistor may have a value of about 400 ohms. The pad 158 may be connected to a first input of a tri-statable input buffer. A second input of the tri-statable input buffer may receive the signal RPDN. An output of the tri-statable buffer may present a signal (e.g., BZHOLD).

An output of the block 410 may be presented to an input of the block 412. A first output of the block 412 may be connected to the pad 158. A number of other outputs of the block 412 may be connected together and connected to a non-inverting input of the block 418. An output of the block 414a and the block 414b may be connected to the non-inverting input of the block 418. An output of the blocks 416a and 416b may be present to the non-inverting input of the block 418. An inverting input of the block 418 may be set to a reference voltage. In one example, the reference voltage may be approximately one-half the I/O voltage supply (e.g., VDDIO/2). The block 418 may have an output that may present a signal (e.g., Z).

Figure 22:
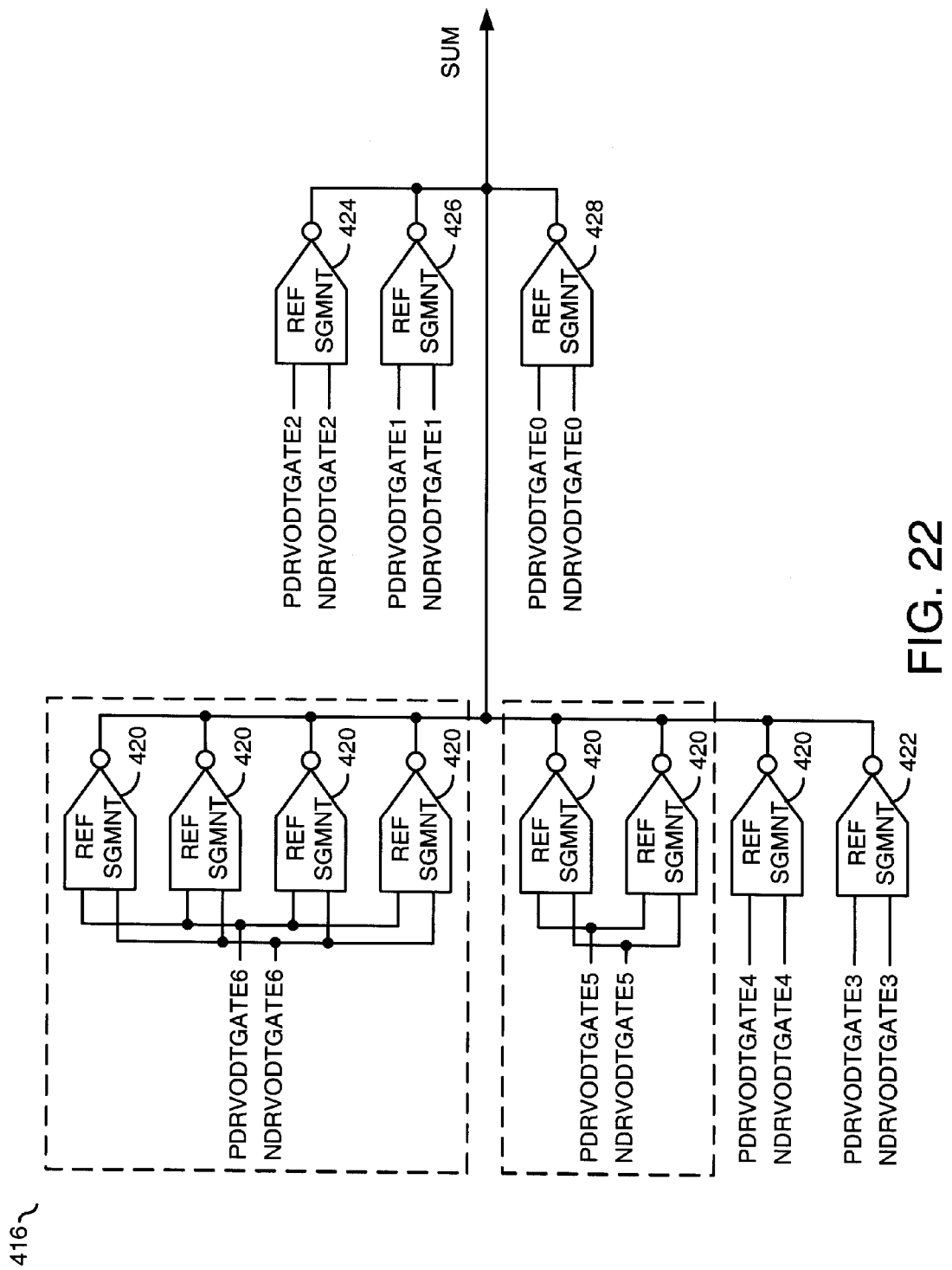
FIG. 22 is a diagram illustrating a fine-granularity calibration network in a reference cell implemented in accordance with the present invention.

Referring to FIG. 22, a diagram is shown illustrating a calibration network in a reference cell in accordance with the present invention. In one example, the reference cell calibration network may be implemented similarly to the 7-bit ODT network in the driver, but with the most significant bit (MSB) removed and a least significant bit (LSB) added. The calibration network implemented in accordance with the present invention may reduce calibration current to one-eighth for driver and one-half for ODT. The calibration network in accordance with the present invention may minimize errors associated with parasitic resistances, make design for electromigration in the reference cell practical and reduce a size of a calibration digital to analog convertor in half. In one example, bits 6, 5 and 4 of the calibration network may be implemented with reference segments 420 configured to provide an impedance of about 1,152 ohms, bit 3 of the calibration network may comprise reference segments 422 having an impedance of about 2,304 ohms, bit 2 of the calibration network may comprise a reference segment 424 having an impedance of about 4,608 ohms, bit 1 of the calibration network may comprise a reference segment 426 having an impedance of about 9,216 ohms, and bit 0 of the calibration network may comprise a reference segment 428 having an impedance of about 18,512 ohms.

Figure 23:
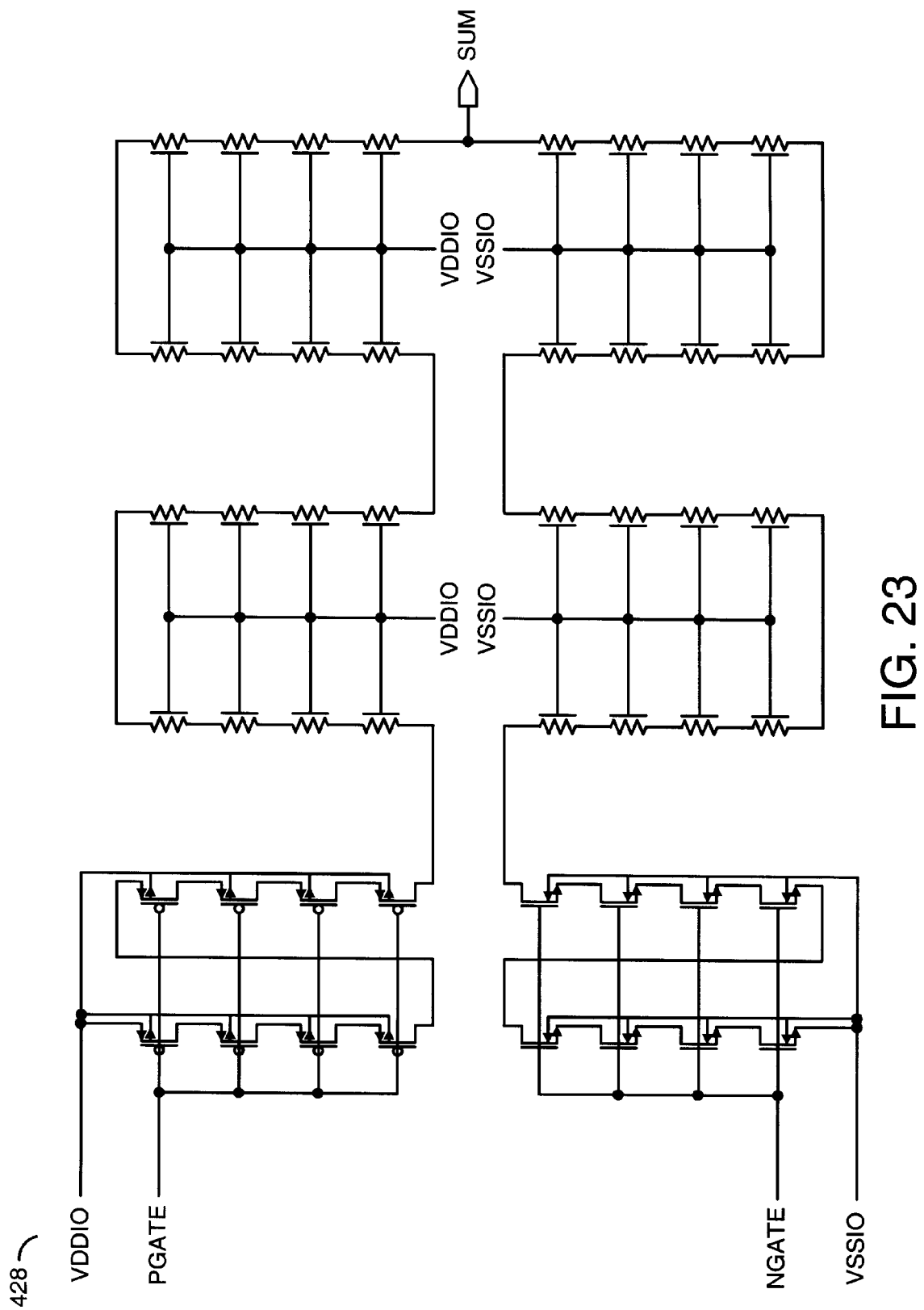
FIG. 23 is a diagram illustrating an example implementation of a least significant bit of the reference cell calibration network of FIG. 20.

Referring to FIG. 23, a diagram is shown illustrating an example implementation of a least significant bit (bit 0) in the reference cell calibration network of FIG. 22. The least significant bit in the reference cell calibration network is generally implemented similarly to the ODT-capable segment 188 and may comprise, for example, eight series transistors and sixteen series resistors per channel.

Figure 24B:
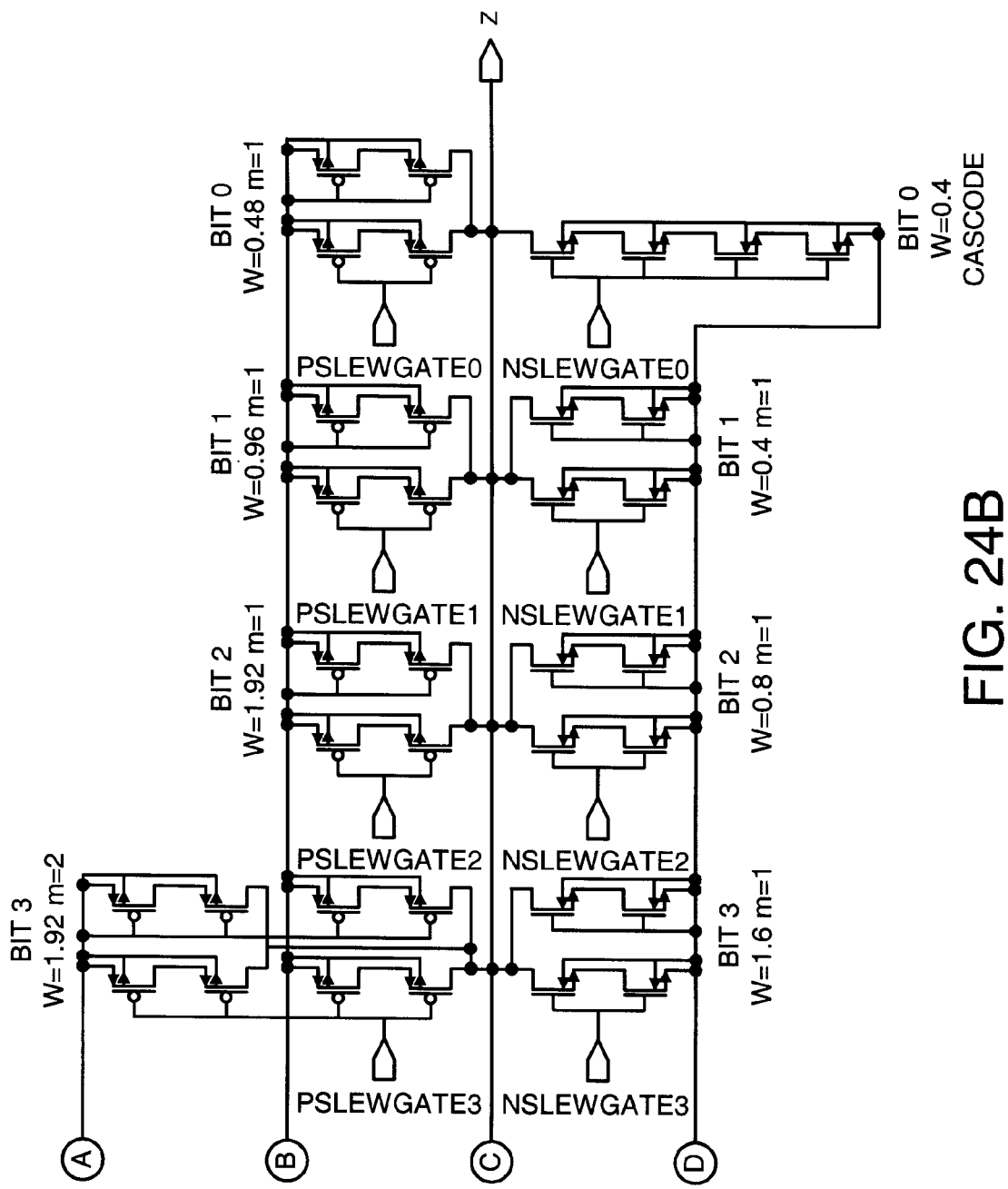
FIG. 24 is a diagram illustrating an example implementation of the reference cell slew calibration network in accordance with a preferred embodiment of the present invention.

Referring to FIG. 24, a diagram is shown illustrating an example implementation of a slew calibration network in accordance with a preferred embodiment of the present invention.

The present invention may provide a bidirectional I/O cell capable of meeting all 1.5V and 1.8V SSTL and HSTL receiver, output driver, and built-in termination (e.g., on-die termination) signaling specifications (e.g., DDR2, DDR3, RLDRAM, QDR, etc.). The input/output cell in accordance with the present invention generally has the following features/characteristics: user-selectable impedance covering a wide range (e.g., 18 ohms to 75 ohms) with fine granularity (e.g., within 5% of any targeted impedance in that range); process, voltage, and temperature compensation of the output driver impedance; linear I-V characteristics (e.g., impedance at I/O voltages of 20% VDDIO and 80% VDDIO are generally within 10% of the impedance at I/O voltage of 50% VDDIO); multiple I/O transmit voltages (VDDIO 1.5+−10% as well as VDDIO 1.8V+−10%).

On-die termination features/characteristics generally include: Thevenin-equivalent termination (TET) to synthesized VDDIO/2 (e.g., 50 ohm to VDDIO/2 may be achieved with 100 ohms to VSSIO in parallel with 100 ohm to VDDIO); user-selectable TET impedance covering a wide range (e.g., 36 ohms to 150 Ohms) with fine granularity (e.g., within 5% of any targeted impedance in the specified range); process, voltage, and temperature compensation of the output driver impedance; linear I-V characteristics (e.g., impedance at I/O voltages of 20% of VDDIO and 80% of VDDIO are generally within 10% of the impedance at an I/O voltage of 50% VDDIO); covers multiple I/O voltages (VDDIO 1.5+−10% as well as VDDIO 1.8V+−10%).

The input receiver may have the following characteristics: compares input voltage to an externally provided reference voltage (e.g., VDDIO/2); capable of processing a wide range of input voltage swings (e.g., from +−200 mV to full rail-to-rail VSSIO-VDDIO swing); built in filter on the Vref input.

The peak operating frequency (for transmit) may be user-programmable; permitting slew rate/di/dt reduction. The predriver may: include 5-bit programmable waveshaping circuitry completely "orthoganal" to the driver impedance setting; allow user to set the "predriver" strength from 1.5V 800 MHz capable (strongest pre-driver) all the way to 1.8V 200 MHz capable (weakest predriver); permit PVT compensation of the predrive output strength; provide tighter output slew rate tolerance as well as minimizing di/dt for a particular peak operating frequency.

Dynamic ODT control in accordance with the present invention may include providing: a very fast turn-around from drive mode to ODT-on receive mode; a built-in sequencer that avoids excessive currents when switching between drive-mode and receive-mode; a fast delay-matched ODT turn-on and turn-off that permits power savings by turning off the ODT when the ODT is not being used.

The present invention generally provides (i) a merged driver-ODT (e.g., having standard rmos segments, some of which are driver-capable and others of which are ODT capable) with excellent code linearity and reduced power/current density, (ii) an output-driver/termination impedance calibration metrology that combines a wide-range impedance setting with PVT compensation information and (iii) multiple bondsite attachment locations to save a routing layer for pad-over-I/O.

An I/O cell in accordance with the present invention generally supports the following high speed memory interface industry standards and electrical specifications: RLDRAM; QDRII+ SRAM; DDRII+ SRAM; QDRII SRAM; DDRII SRAM; DDR2 SDRAM; DDR3 SDRAM. The I/O cell generally allows the user to interchange/migrate among the list of supported memory specifications (e.g., from a DDR2 memory interface to a DDR3 memory interface) without changing silicon. Also, when multiple memory controllers are instantiated in the silicon for both RLDRAM and SRAM, the user may interchange/migrate from RLDRAM to SRAM memory interface solutions without a change in silicon.

In one example, the I/O cell of the present invention may be scaled down to only support DDR2 and DDR3 memory interface solutions. In another example, the I/O cell of the present invention may be scaled down to only support RLDRAM and SRAM memory interfaces. Other alternatives may include stripping or adding features from the current I/O design.

While the invention has been particularly shown and described with reference to the preferred embodiments thereof, it will be understood by those skilled in the art that various changes in form and details may be made without departing from the scope of the invention.

The invention claimed is:

1. An input/output (I/O) cell comprising:
a predriver circuit configured to generate a first driver control signal and a second driver control signal in response to a drive control signal, a on-die termination control signal, a slew control signal, and a data output signal, wherein said predriver circuit comprises a binary programmable predriver comprising (i) a plurality of first drivers, each first driver comprising a programmable binary weighted cascode ngate driver, and (ii) a plurality of second drivers, each second driver comprising a programmable binary weighted cascode pgate driver;
an output driver circuit comprising (i) a plurality of driver-capable segments configured to provide a binary weighted drive network and (ii) a plurality of on-die termination (ODT) capable segments configured to provide a binary weighted termination network, wherein said output driver circuit is configured (i) to drive an input/output pad in a first mode and (ii) provide on-die termination of said input/output pad in a second mode in response to said first driver control signal and said second driver control signal.

2. The input/output cell according to claim 1, wherein said input/output cell is configurable to meet drive impedance ranges, ODT impedance ranges, I/O voltage ranges and slew rate ranges for any of a plurality of memory interface specifications in response to (i) a drive control signal, (ii) a on-die termination control signal and (iii) a slew control signal.

3. The input/output cell according to claim 1, further comprising a receiver circuit configured to receive an input signal from said input/output pad and compare a voltage level of said input signal with a predetermined reference voltage.

4. The input/output cell according to claim 1, further comprising a control circuit configured to interface said input/output cell with an integrated circuit core and generate (i) said drive control signal, (ii) said on-die termination control signal, (iii) said slew control signal and (iv) said data signal.

5. The input/output cell according to claim 1, further comprising:
a control circuit configured (i) to generate said drive control signal, said on-die termination control signal, said slew control signal, and said data output signal and (ii) to receive a data input signal;
and
a receiver circuit configured to receive an input signal from said input/output pad, compare a voltage level of said input signal with a predetermined reference voltage, and present a data input signal to said control circuit.

6. The input/output cell according to claim 5, wherein said control circuit comprises a core interface circuit.

7. The input/output cell according to claim 1, wherein said binary programmable predriver circuit further comprises:
and
an on-die termination (ODT) sequencer.

8. The input/output cell according to claim 7, wherein said ODT sequencer provides dynamic switching between an input/output mode and a termination mode.

9. The input/output cell according to claim 7, wherein said on-die termination (ODT) sequencer comprises a dynamic on-die termination sequencer comprising:
a first circuit configured to generate a on-die termination mode control signal in response to an enable signal, a termination control signal and a data signal; and
a second circuit configured to generate a driver mode control signal in response to the enable signal, the termination control signal and the data signal.

10. The input/output cell according to claim 1, wherein said programmable binary weighted cascode ngate driver comprises a programmable 5-bit binary weighted cascode driver and each of said plurality of first drivers further comprises:
a multiplexer circuit; and
a NAND data path.

11. The input/output cell according to claim 1, wherein said programmable binary weighted cascode pgate driver comprises a programmable 5-bit binary weighted cascode driver and each of said plurality of second drivers further comprises:
a multiplexer circuit; and
a NOR data path.

12. The input/output cell according to claim 1, wherein each of said plurality of driver-capable segments comprises a first transistor, a second transistor, a first resistor, a second resistor a third resistor, and a fourth resistor, a source of the first transistor receives an I/O supply voltage, a gate of the first transistor receives said first driver control signal, a drain of the first transistor is connected to a first terminal of the first resistor and a first terminal of the second resistor, a second terminal of the first resistor, a second terminal of the second resistor, a first terminal of the third resistor and a first terminal of the fourth resistor are connected together, a second terminal of the third resistor and a second terminal of the fourth resistor are connected to a drain of the second transistor, a gate of the second transistor receives said second driver control signal, and a source of the second transistor is connected to an I/O power supply ground potential.

13. The input/output cell according to claim 12, wherein the resistors comprise oxide-isolated poly resistors.

14. The input/output cell according to claim 1, wherein at least one of said plurality of ODT-capable segments comprises a first transistor, a second transistor, a first resistor, a second resistor a third resistor, a fourth resistor, a fifth resistor, a sixth resistor, a seventh resistor, and an eighth resistor, a source of the first transistor receives an I/O supply voltage, a gate of the first transistor receives said first driver control signal, a drain of the first transistor is connected to a first terminal of the first resistor and a first terminal of the second resistor, a second terminal of the first resistor is connected to a first terminal of the third resistor, a second terminal of the second resistor is connected to a first terminal of the fourth resistor, a second terminal of the third resistor, a second terminal of the fourth resistor, a first terminal of the fifth resistor and a first terminal of the sixth resistor are connected together, a second terminal of the fifth resistor is connected to a first terminal of the seventh resistor, a second terminal of the sixth resistor is connected to a first terminal of the eighth resistor, a second terminal of the seventh resistor and a second terminal of the eighth resistor are connected to a drain of the second transistor, a gate of the second transistor receives said second driver control signal, and a source of the second transistor is connected to an I/O power supply ground potential.

15. The input/output cell according to claim 14, wherein the resistors comprise oxide-isolated poly resistors.

16. The input/output cell according to claim 1, wherein at least one of said plurality of ODT-capable segments comprises a first tied-off field effect transistor and two series resistors configured as a pull-up and a second tied-off field effect transistor and two series resistors configured as a pull-down.

17. The input/output cell according to claim 1, wherein at least one of said plurality of ODT-capable segments comprises two series field effect transistors and four series resistors configured as a pull-up and two series field effect transistors and four series resistors configured as a pull-down.

18. The input/output cell according to claim 1, wherein at least one of said plurality of ODT-capable segments comprises four series field effect transistors and eight series resistors configured as a pull-up and four series field effect transistors and eight series resistors configured as a pull-down.

19. An input/output (I/O) cell comprising:
a plurality of driver-capable segments configured to provide a binary weighted drive network; and
a plurality of on-die termination (ODT) capable segments configured to provide a binary weighted termination network, wherein said I/O cell is configured to drive an input/output pad in a first mode and provide on-die termination of said input/output pad in a second mode, and wherein each of said plurality of driver-capable segments comprises a first transistor, a second transistor, a first resistor, a second resistor a third resistor, and a fourth resistor, a source of the first transistor receives an I/O supply voltage, a gate of the first transistor receives said first driver control signal, a drain of the first transistor is connected to a first terminal of the first resistor and a first terminal of the second resistor, a second terminal of the first resistor, a second terminal of the second resistor, a first terminal of the third resistor and a first terminal of the fourth resistor are connected together, a second terminal of the third resistor and a second terminal of the fourth resistor are connected to a drain of the second transistor, a gate of the second transistor receives said second driver control signal, and a source of the second transistor is connected to an I/O power supply ground potential.

20. An input/output (I/O) cell comprising:
a plurality of driver-capable segments configured to provide a binary weighted drive network; and
a plurality of on-die termination (ODT) capable segments configured to provide a binary weighted termination network, wherein said I/O cell is configured to drive an input/output pad in a first mode and provide on-die termination of said input/output pad in a second mode, and wherein at least one of said plurality of ODT-capable segments comprises a first transistor, a second transistor, a first resistor, a second resistor a third resistor, a fourth resistor, a fifth resistor, a sixth resistor, a seventh resistor, and an eighth resistor, a source of the first transistor receives an I/O supply voltage, a gate of the first transistor receives said first driver control signal, a drain of the first transistor is connected to a first terminal of the first resistor and a first terminal of the second resistor, a second terminal of the first resistor is connected to a first terminal of the third resistor, a second terminal of the second resistor is connected to a first terminal of the fourth resistor, a second terminal of the third resistor, a second terminal of the fourth resistor, a first terminal of the fifth resistor and a first terminal of the sixth resistor are connected together, a second terminal of the fifth resistor is connected to a first terminal of the seventh resistor, a second terminal of the sixth resistor is connected to a first terminal of the eighth resistor, a second terminal of the seventh resistor and a second terminal of the eighth resistor are connected to a drain of the second transistor, a gate of the second transistor receives said second driver control signal, and a source of the second transistor is connected to an I/O power supply ground potential.

21. An input/output (I/O) cell comprising:

a plurality of driver-capable segments configured to provide a binary weighted drive network; and a plurality of on-die termination (ODT) capable segments configured to provide a binary weighted termination network, wherein said I/O cell is configured to drive an input/output pad in a first mode and provide on-die termination of said input/output pad in a second mode, and wherein at least one of said plurality of ODT-capable segments comprises two series field effect transistors and four series resistors configured as a pull-up and two series field effect transistors and four series resistors configured as a pull-down.

22. An input/output (I/O) cell comprising:

a plurality of driver-capable segments configured to provide a binary weighted drive network; and a plurality of on-die termination (ODT) capable segments configured to provide a binary weighted termination network, wherein said I/O cell is configured to drive an input/output pad in a first mode and provide on-die termination of said input/output pad in a second mode, and wherein at least one of said plurality of ODT-capable segments comprises four series field effect transistors and eight series resistors configured as a pull-up and four series field effect transistors and eight series resistors configured as a pull-down.

* * * * *